(12) United States Patent
Kaymaksut et al.

(10) Patent No.: US 11,677,392 B2
(45) Date of Patent: Jun. 13, 2023

(54) BIAS NETWORKS FOR DC OR EXTENDED LOW FREQUENCY CAPABLE FAST STACKED SWITCHES

(71) Applicant: Analog Devices International Unlimited Company, Limerick (IE)

(72) Inventors: Ercan Kaymaksut, Istanbul (TR); Mehmet Arda Akkaya, Istanbul (TR); Murat Davulcu, Istanbul (TR); Turusan Kolcuoglu, Sariyer (TR)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 17/233,415

(22) Filed: Apr. 16, 2021

(65) Prior Publication Data
US 2022/0337233 A1 Oct. 20, 2022

(51) Int. Cl.
*H03K 17/06* (2006.01)
*H03K 17/041* (2006.01)
(Continued)

(52) U.S. Cl.
CPC ..... *H03K 17/04106* (2013.01); *H03K 17/063* (2013.01); *H03K 17/102* (2013.01); *H03K 17/693* (2013.01)

(58) Field of Classification Search
CPC .......... H03K 17/04106; H03K 17/063; H03K 17/102; H03K 17/693; H03K 17/6874; H03H 11/02
See application file for complete search history.

(56) References Cited

U.S. PATENT DOCUMENTS 7,786,787 B2 8/2010 Brindle
9,520,251 B2 12/2016 Keane et al.
(Continued)

FOREIGN PATENT DOCUMENTS

EP 2870694 A2 5/2015
WO WO 2014/011510 A2 1/2014

OTHER PUBLICATIONS

Madan et al., Fully Integrated Switch-LNA Front-End IC Design in CMOS: A Systematic Approach for WLAN. IEEE Journal of Solid-State Circuits. Nov. 2011; 46(11):2613-2622.
(Continued)

*Primary Examiner* — Jung Kim
(74) *Attorney, Agent, or Firm* — Wolf, Greenfield & Sacks, P.C.

(57) ABSTRACT

Passive gate bias network topologies are implemented for stacked FET switch structures, which improve the settling time and low cut-off frequency for both DC and non-DC operation. DC capable stacked switch bias structures provide gate and bulk bias voltages, using input DC voltages, which are coupled to the gate terminals and the bulk terminals of the stacked switches. The DC coupling can be achieved using resistors, or a combination of resistors and diodes. An exemplary SPST switch includes a series stacked switch in combination with a shunt stacked switch, which can be controlled between alternating states. For low cut-off frequency improvement structures, an input signal is coupled to the gate terminals and bulk terminals of the switches in the stacked switches, using a DC block capacitor and resistors. The low cut-off of the bulk can be improved by connecting the bulk terminal of one switch to the opposite polarity switch.

27 Claims, 14 Drawing Sheets

(51) Int. Cl.
    *H03K 17/10*     (2006.01)
    *H03K 17/693*     (2006.01)

(56) References Cited

U.S. PATENT DOCUMENTS

| | | |
|---|---|---|
| 9,712,158 B1 | 7/2017 | Cavus et al. |
| 9,716,477 B2 | 7/2017 | Wagh et al. |
| 9,742,400 B2 | 8/2017 | Bakalski et al. |
| 9,768,770 B2 | 9/2017 | Campbell |
| 9,882,549 B2 | 1/2018 | Ashry Othman |
| 10,044,349 B2 | 8/2018 | Scott et al. |
| 10,103,712 B2 | 10/2018 | Ashry Othman et al. |
| 10,148,265 B2 | 12/2018 | Lu et al. |
| 10,158,345 B2 | 12/2018 | Reedy et al. |
| 10,211,830 B2 | 2/2019 | Brindle et al. |
| 10,523,195 B1 | 12/2019 | Luo et al. |
| 10,541,682 B2 | 1/2020 | Popplewell et al. |
| 10,693,459 B2 | 6/2020 | Blin |
| 10,790,820 B2 | 9/2020 | Burgener et al. |
| 2015/0022256 A1 | 1/2015 | Sprinkle et al. |
| 2017/0134016 A1 | 5/2017 | Ranta |
| 2020/0382114 A1* | 12/2020 | Scott .................... H03K 17/567 |

OTHER PUBLICATIONS

Nguyen et al., A K-Band High Power and High Isolation Stacked-FET Single Pole Double Throw MMIC Switch Using Resonating Capacitor. IEEE Microwave and Wireless Components Letters. Sep. 2016; 26 (9); 696-698.

* cited by examiner

BIAS NETWORKS FOR DC OR EXTENDED LOW FREQUENCY CAPABLE FAST STACKED SWITCHES

FIELD OF THE DISCLOSURE

Aspects described herein relate generally to a method and apparatus for wideband switch products, and products that incorporate wideband switches.

BACKGROUND

Stacked silicon on insulator (SOI) complementary metal-oxide semiconductor (CMOS) switches are used in wideband switch products. Stacking of the switches provides greater voltage breakdown protection than a single constituent switch. However, conventionally such stacked SOI CMOS switches pass only alternating current (AC) signals, and not direct current (DC) signals. There is a lowest frequency that they will pass due to how they operate. To turn the switches of the stack ON, a direct current (DC) signal is applied to the gate terminals of the individual switches. The DC signal has a voltage greater than the threshold turn-on voltage of the switches. An AC signal can be passed by the stack of switches because the AC signal will be bootstrapped from the drain terminal of each switch to the gate terminal of that switch and from the gate terminal of the switch to the source terminal of the switch through the gate-drain capacitance and gate-source capacitance. The AC signal therefore progresses through the stack of switches in this manner. This bootstrapping behavior ensures that the individual switches of the stack remain in an ON state even if the voltage of the AC signal being passed differs from the DC voltage applied to the gate terminals by more than the threshold turn-on voltage of the switches because the same AC voltage will be present on the drain, gate, and source terminals of the switch, and therefore the gate-source voltage will be substantially the DC voltage applied at the gates.

However, the bootstrapping behavior does not apply to a low frequency AC signal or a DC signal. Application of a low frequency AC signal or a DC signal to the input terminal of the stack may, therefore, cause the switches in the stack to inadvertently turn off, if the magnitude of the low frequency AC signal or DC signal applied at the input terminal of the stack differs sufficiently from the DC voltage applied to the gate terminals.

The lowest frequency at which the bootstrapping behavior will work and enable the stacked switch configuration to pass a signal is impacted by the gate resistances of the switches. Larger gate resistances enhance the bootstrapping behavior and lower the lowest operable frequency which the stacked switches can pass. However, the larger the gate resistance of a switch, the longer the settling time of the switch, meaning the switch turns ON or OFF more slowly. Thus, conventionally, the use of a large gate bias resistor lowers the low cut-off frequency of the stacked switches, but increases the settling time penalty. In addition, such topologies cannot handle direct current (DC) voltage.

SUMMARY OF THE DISCLOSURE

Passive gate bias network topologies are implemented for stacked FET switch structures, which can improve the settling time and low cut-off frequency for both DC and non-DC operation. DC capable stacked switch bias structures provide gate terminal and bulk terminal bias voltages, using input DC voltages, which are coupled to the gate terminals and the bulk terminals of the stacked switches. The DC coupling can be achieved using resistors, or a combination of resistors and diodes. An exemplary single-pole single-throw (SPST) switch includes a series stacked switch in combination with a shunt stacked switch, which can be controlled between alternating states. For low cut-off frequency improvement structures, an input signal is coupled to the gate terminals and bulk terminals of the switches making up the stacked switches, using a DC block capacitor and resistors. The low cut-off frequency of the bulk can be improved by connecting the bulk terminal of one switch to the opposite polarity switch.

According to some aspects of the application, an apparatus comprises a stacked switch comprising a plurality of series-connected switches from a first switch to a last switch, each switch of the plurality of series-connected switches having a gate terminal, a source terminal, and a drain terminal, and a passive gate bias network electrically connected to the drain terminal of the first switch of the plurality of series-connected switches and the gate terminals of the plurality of series-connected switches, and configured to successively reduce, from the first switch to the last switch, a voltage applied to respective gate terminals of the plurality of series-connected switches According to some aspects of the application, an apparatus comprises a series stacked switch having an input terminal configured to receive an input signal and an output terminal configured to provide an output signal of the series stacked switch, a shunt stacked switch having an input terminal coupled to the output terminal of the series stacked switch and an output terminal coupled to a reference potential, a first passive gate bias network coupled to gate terminals of the series stacked switch and configured to apply successively decreasing voltages to respective gate terminals of the series stacked switch, and a second passive gate bias network coupled to gate terminals of the shunt stacked switch and configured to apply successively decreasing voltages to respective gate terminals of the shunt stacked switch.

According to some aspects of the invention, an apparatus comprises a series stacked switch having an input terminal configured to receive an input signal and an output terminal configured to provide an output signal of the series stacked switch, a shunt stacked switch coupled to the series stacked switch, and means for applying successively decreasing voltages to gate terminals of the series stacked switch.

According to some aspects of the present application, a stacked switch can be used to switchably pass a DC signal, wherein the DC signal is applied to the input terminal of the stacked switch, and the gate terminals of the stacked switch are switchably controlled to turn the stacked switch ON and OFF as desired, wherein the DC signal passes through the stacked switch to an output terminal when the stacked switch is turned ON. Passing the DC signal may comprise biasing gate terminals of the stacked switch with a passive gate biasing network to a degree that provides for the gate-to-source voltage of the switches of the stacked switch to remain below a gate-to-source breakdown voltage.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Aspects of the present application provide passive bias networks for biasing the gate terminals of stacked switches. Stacked switches have two or more switches coupled in series. The switches may be field effect transistors (FETs), and the stacked switch may be a stacked FET switch. An input signal may be applied to the drain terminal of one of the FETs of the stacked switch, and an output signal taken from the source terminal of the last switch in the stack. Such a configuration is used to provide increased voltage capability compared to a single FET switch. According to aspects of the present application, a passive bias network is coupled to the gate terminals of the stacked switches (e.g., stacked FET switches) to step down the voltage across the individual switches, thereby maintaining a desired gate to source voltage of each switch in the stack. Biasing the stacked FET switches in this manner improves settling time and lowers the cut-off frequency of the stacked FET switch in at least some embodiments, including allowing the stacked FET switch to pass a DC signal in at least some embodiments.

Several exemplary embodiments of single-pole single-throw (SPST) switches are described, that include a series stacked switch in combination with a shunt stacked switch and passive gate terminal bias structures. To lower the low cut-off frequency, an input signal is coupled to the gate terminals and bulk terminals of the FETs in the stack, using a DC block capacitor and resistors. The low cut-off frequency of the stacked switch can be improved by connecting the bulk terminal of one switch to the opposite polarity switch.

The system topologies described herein can be configured for both DC and non-DC operation of the stacked FET switch structures. The system topologies may also provide for fast settling time operation of the switch structures.

Figure 1:
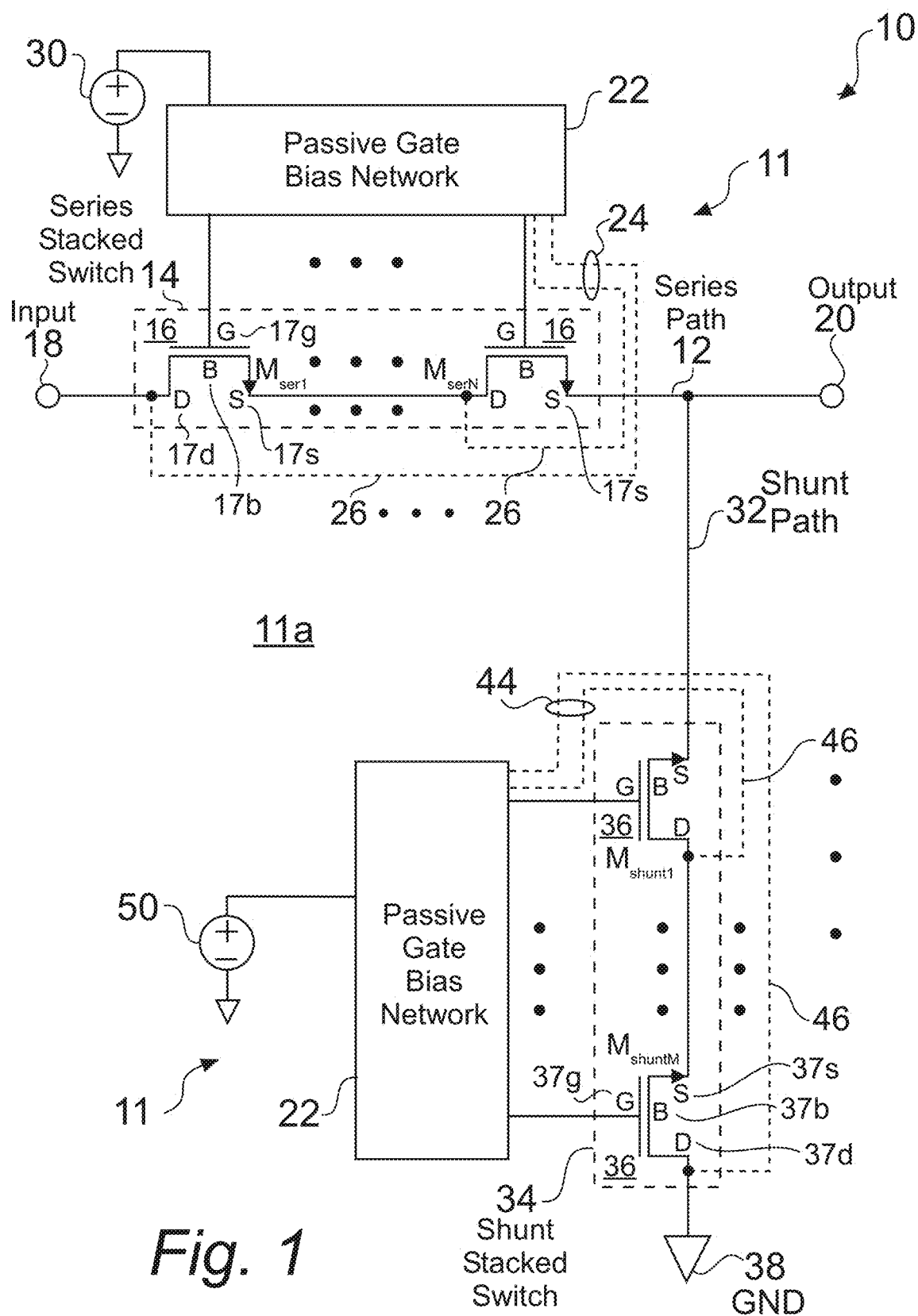
FIG. 1 is a schematic view of an exemplary topology for stacked switch structures having passive gate bias networks.
Figure 2:
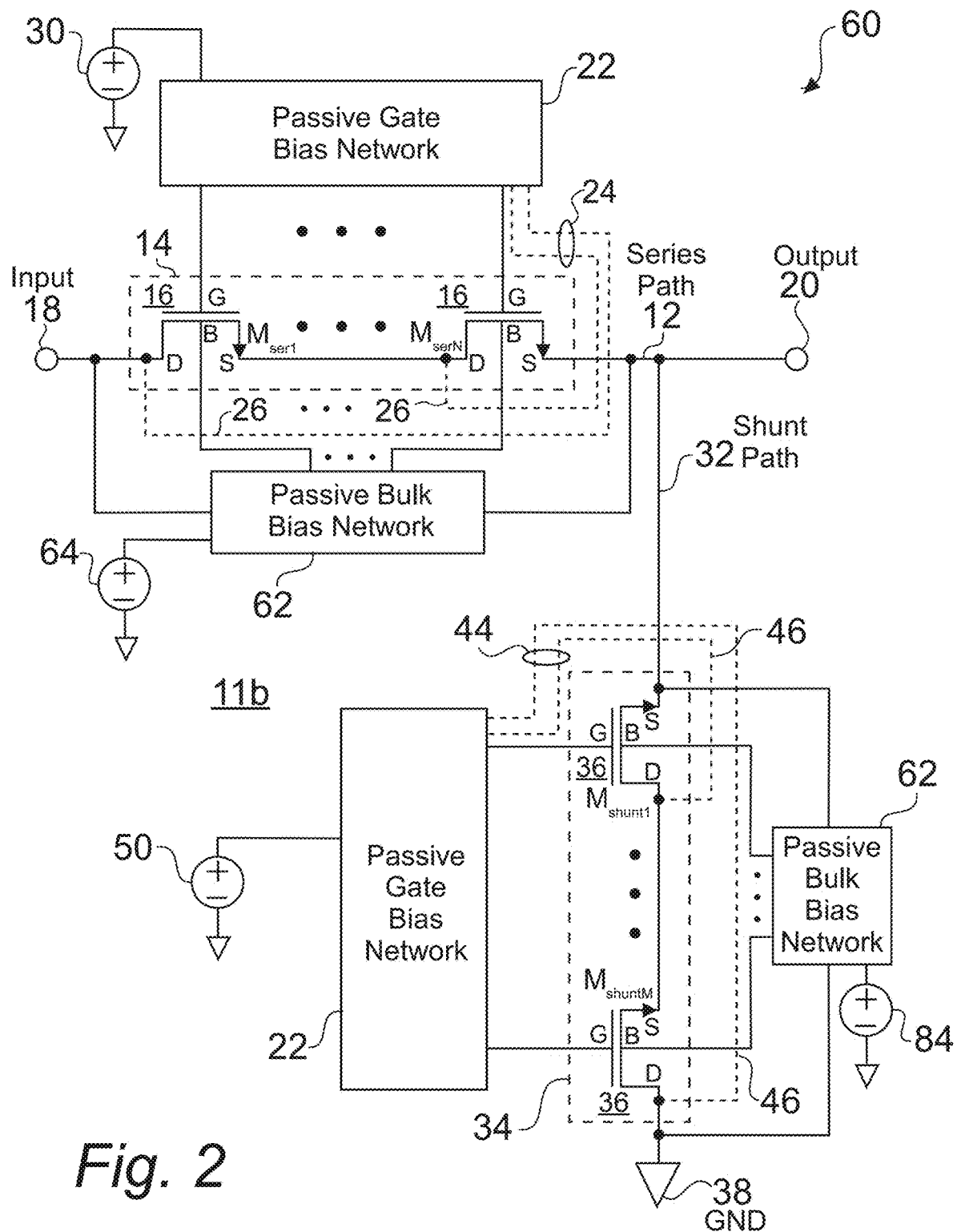
FIG. 2 is a schematic view of an exemplary topology for stacked switch structures having passive gate bias networks, which also shows passive bulk bias networks.

FIG. 1 is a schematic view 10 of an exemplary topology for a stacked switch network 11a, having a passive gate bias network 22 associated with one or more stacked switches, such as for a series stacked switch 14 or for a shunt stacked switch 34. FIG. 2 is a schematic view of an exemplary topology 60 for a stacked switch network 11b having a passive gate bias network 22 associated with one or more stacked switches 14, 34, which also shows associated bulk terminal connections, such as provided by passive bulk bias networks 62, e.g., a first passive bulk bias network 62 connected between a control voltage 64 and bulk terminals 17b of series switches 16, and a second passive bulk bias network 62 connected between a control voltage 84 and bulk terminals 37b of the shunt switches 36.

The exemplary series stacked switch 14 seen in FIG. 1 and FIG. 2 includes a plurality of field effect transistor (FET) switches 16, such as described herein as series switches $M_{ser1}$-$M_{serN}$, wherein N is an integer greater than or equal to two, connected in series along a series path 12, between an input 18 and an output 20. Each of the FET switches 16, e.g., $M_{ser1}$, includes an associated gate terminal 17g, a drain terminal 17d, a source terminal 17s, and a bulk terminal 17b.

An input signal 18 may be applied to the drain terminal 17d of one of the FET switches 16 (e.g., the first switch in the series), and an output signal 20 can be taken from the source terminal 17s of the last switch 16, in the series stacked switch 14. Such a configuration can be used to provide increased voltage capability compared to a single switch 16. According to aspects of the present application, a passive gate bias network 22 is coupled to the gate terminals 17g of the stacked switches 16, to step down the voltage across the switches $M_{ser1}$-$M_{serN}$, thereby maintaining a desired gate to source voltage $V_{GS}$ of each switch 16 in the stacked switch 14.

The exemplary shunt stacked switch 34 seen in FIG. 1 and FIG. 2 includes a plurality of field effect transistor (FET) switches 36, such as described herein as shunt switches $M_{shunt1}$-$M_{shuntM}$, wherein M is an integer greater than or equal to two, connected in series along a shunt path 32, between the output 20 and a reference potential 38, which may be a ground potential in at least some embodiments. Each of the switches 36, e.g., $M_{shunt1}$, includes an associated gate terminal 37g, a drain terminal 37d, a source terminal 37s, and a bulk terminal 37b.

The exemplary stacked switch networks 11a and 11b seen in FIG. 1 and FIG. 2 can be configured to function as a single pole single throw (SPST) switch, wherein the series stacked switch 14 can be operated as a series switch, in conjunction with the shunt stacked switch 34, which can be operated as a shunt switch. As such, the exemplary stacked switch network 11a seen in FIG. 1 can operate in a through state, when the series stacked switch 14 is in an ON state, providing a conductive path 12 between the input 18 and an output 20, while the shunt stacked switch 34 is in an OFF state, isolating the output 20 from reference potential 38 (e.g., GND). The exemplary stacked switch networks 11a and 11b seen in FIG. 1 and FIG. 2 can also be switched from the through state, to operate in an isolation state, whereby the series stacked switch 14 is controlled to be in an OFF state, isolating the input 18 from the output 20, while the shunt stacked switch 34 is controlled to be in an ON state, connecting the output 20 to the reference potential 38, for example along the shunt path 32.

The exemplary stacked switch networks 11a and 11b seen in FIG. 1 and FIG. 2 also include a passive gate bias network 22 connected between a control voltage 30 and the series stacked switch 14, as well as a passive gate bias network 22 connected between a control voltage 50 and the shunt stacked switch 34.

The exemplary passive gate bias network 22 associated with the series stacked switch 14 seen in FIG. 1 and FIG. 2 may include gate bias resistors $R_g$ 102 (see, for example, FIGS. 3 and 4) on respective paths connecting the gate terminals 17g of the series switches 16 to control voltage 30. The exemplary passive gate bias network 22 associated with the shunt stacked switch 34 seen in FIGS. 1 and 2 may include gate bias resistors $R_g$ 102 on respective paths connecting the gates 37g of the shunt switches 36 to control voltage 50.

Figure 3:
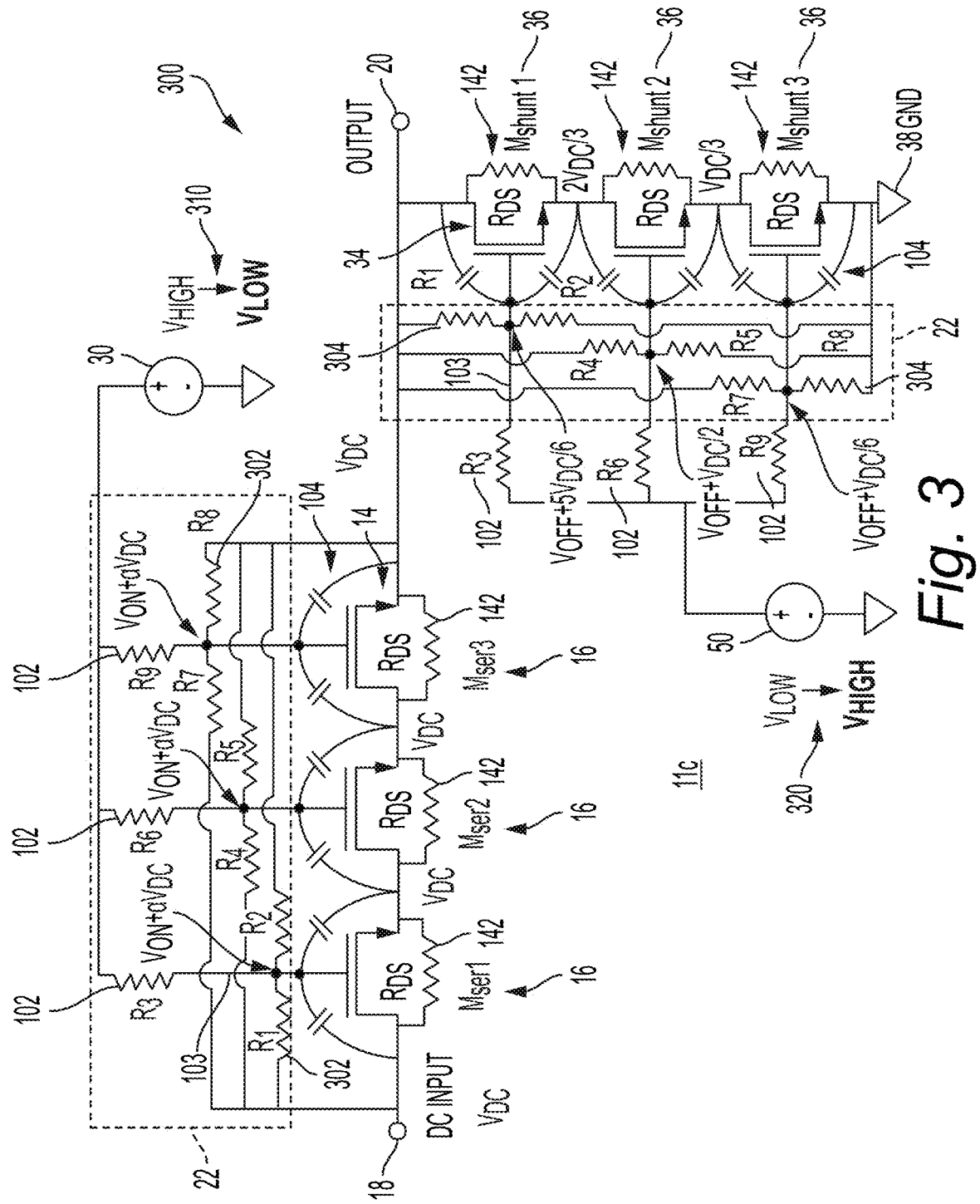
FIG. 3 is a schematic view of a first topology for a DC capable stacked switch bias structure.
Figure 4:
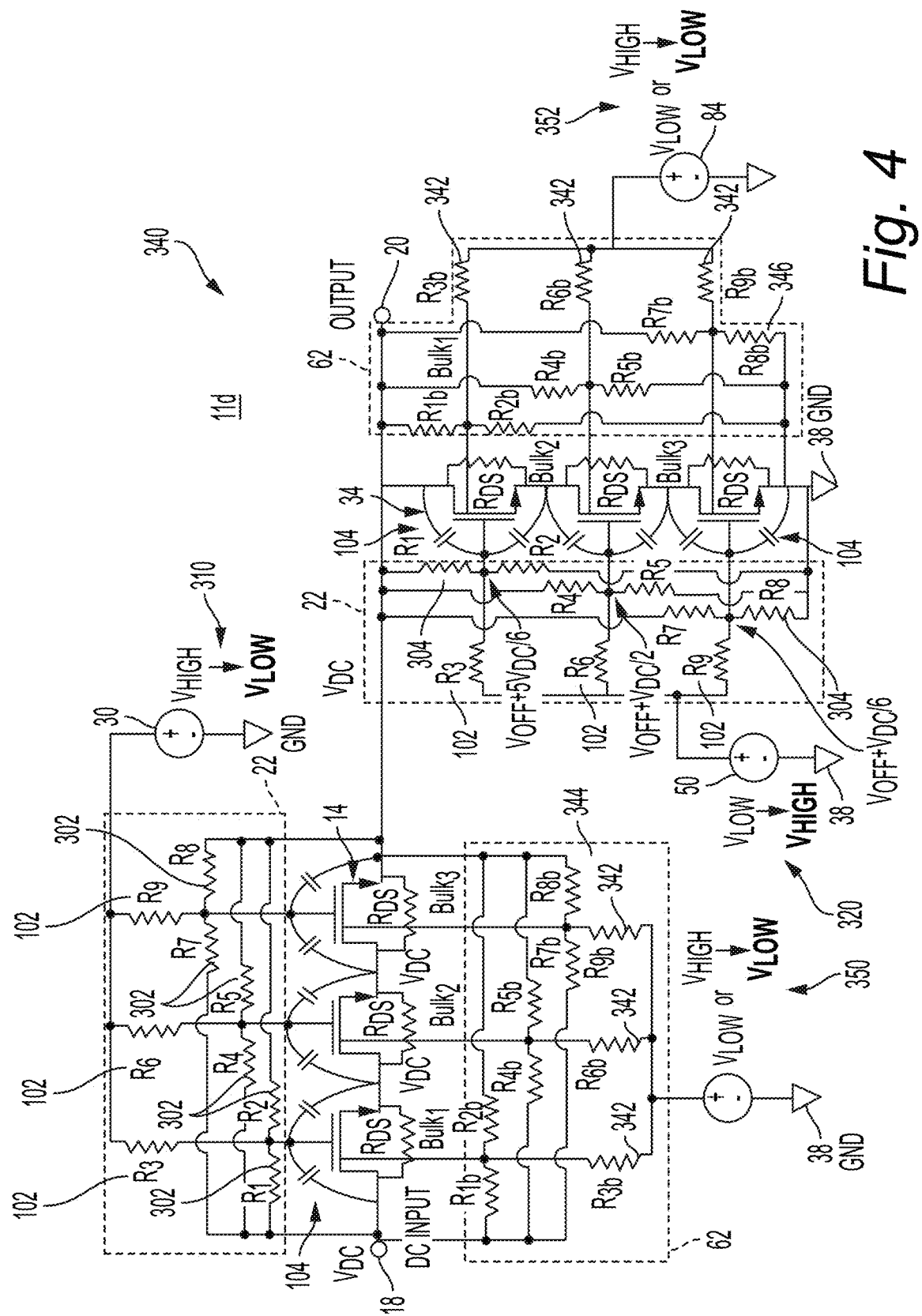
FIG. 4 is a schematic view of an exemplary bulk connection network for a stacked switch structure.

The resistance of the gate bias resistors $R_g$ 102 may be chosen to bootstrap the gate terminals 17g, 37g of the switches 16, 36 respectively in the stacked switches 14,34, to couple an RF signal to the gate terminals 17g, 37g. For example, the use of large gate resistors $R_g$ 102 may be chosen to allow high frequency AC input voltage 18 to pass to the series gate terminals 17g through parasitic gate capacitors $C_g$ 104 representing gate-to-source capacitances, such as shown in FIG. 3 and FIG. 4. In this manner, an AC input signal from an AC input 18 that crosses the gate-source capacitors 104 and gate-drain capacitors 104 is blocked by the large gate resistors $R_g$ 102, so that the AC input 18 just goes from drain terminals to source terminals, e.g., 17d to 17s.

The exemplary stacked switch networks 11, e.g., 11a, 11b, seen in FIGS. 1 and 2 may be used to generate gate bias and bulk bias voltages using input DC voltage, e.g., 30, 50, in which the input voltage is coupled to the gate terminals 17g, 37g and to the body in the form of bulk terminals 17b, 37b. In some embodiments, this DC coupling is can be achieved by resistors 302, 304 (see FIGS. 3 and 4), or by a combination of resistors 362 and diodes 382 (see FIG. 6).

The exemplary stacked switch networks 11a and 11b seen in FIGS. 1 and 2 can be configured for both AC and DC operation. For non-DC operation, the stacked switch networks 11 can be configured to provide a wide range of frequencies, such as for both high frequency operation, e.g., from 26.5 GHz to as high as 70 GHz, as well as for low frequency operations, e.g., less than or equal to 10 MHz. In some embodiments, the stacked switch networks 11 may be configured for frequencies from as low as 10 MHz down to about 9 KHz.

As shown schematically in FIG. 1 and FIG. 2, an exemplary apparatus comprises a supply voltage 30, a stacked switch 14,34 comprising a plurality of series connected switches 16, 36, each of the switches 16, 36 having a gate terminal 17g, 37g, a source terminal 17s, 37s, and a drain terminal 17d, 37d; and a passive gate bias network 22 electrically coupled between the supply voltage 18 and the gate terminals 17g, 37g of the switches 16,36 of the stacked switch 14, 34, wherein the passive gate bias network 22 is electrically connected to the drain terminal 17d, 37d of at least one of the switches 16, 36 of the stacked switch 14, 34 (e.g., the first switch in the stack, closest to the input), through a network 24, 44 of drain paths 26 46, wherein each of the drain paths 26, 46 includes at least one resistor (e.g., 302 and 142, or 304 and 142 (FIGS. 3 and 4); 362 and 364 (FIGS. 5-6, 8); 404 and 142 (FIG. 7); 362 (FIG. 9)), and wherein the passive gate bias network 22 is configured to set the gate voltages of the switches 16, 36 of the stacked switch 14, 34 so that the stacked switch 14, 34 is biased to operate as an OFF or ON switch. In some embodiments, the gate bias network 22 can be connected between the drain terminal 17d, 37d of the first switch or transistor 16, 36 of the stacked switch 14, 34, and the source terminal 17s, 37s of the last switch or 16, 36 transistor of the stacked switch 14, 34.

Figure 6:
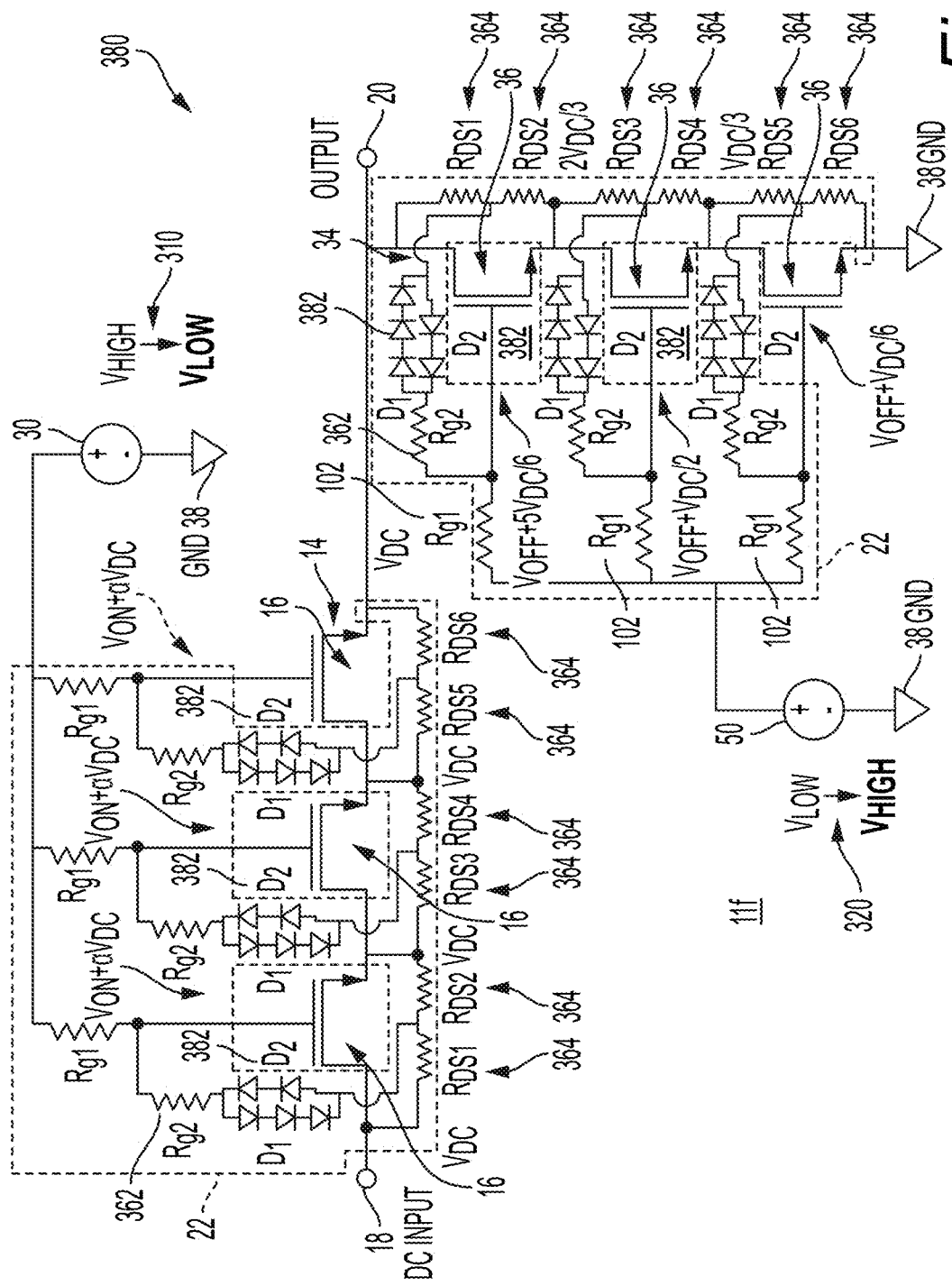
FIG. 6 is a schematic view of a third topology of a DC capable stacked switch bias structure.

In some embodiments, such as seen in FIGS. 3 and 4, the plurality of drain paths 26, 46 comprise a plurality of resistors 302, and 304, as well as shunt resistors 142 that extend between the source terminals 17s, 37s and drain terminals 17d, 36d of respective switches 16,36. In the non-limiting example of FIG. 3, the series stacked switch 14 includes three switches $M_{ser1}$, $M_{ser\_2}$, and $M_{ser3}$, and the shunt stacked switch 34 includes three switches $M_{shunt1}$, $M_{shunt2}$, and $M_{shunt3}$. In some embodiments, such as seen in FIG. 6, each of the plurality of drain paths 26, 46 can include a combination of resistors 362 and diodes 382. As further seen in FIG. 6, the number or value of diodes $D_1$ that allow current to flow from corresponding gate terminals 17g, 37g to drain terminals 17d, 37d may not be required to equal the number or value of diodes $D_2$ that allow current to flow from the corresponding drain terminals 17d, 37d to gate terminals 17g, 37g, such as to allow different voltages to change states 310, 320, e.g., between $V_{LOW}$ and $V_{HIGH}$. In some embodiments, such as seen in FIGS. 7-9, each of the plurality of drain paths 26, 46 can include a combination of resistors, e.g., 404 and 142 (FIG. 7), 362 and 364 (FIG. 8), 362 (FIG. 9), and capacitors, e.g., 402 (FIG. 7), 442 (FIGS. 8, 9).

In some embodiments, such as seen in FIGS. 3-9, the passive gate bias networks 22 may include gate bias resistors $R_g$ 102 on gate bias paths between each of the gate terminals 17g, 37g and corresponding voltage 30, 50.

Figure 5:
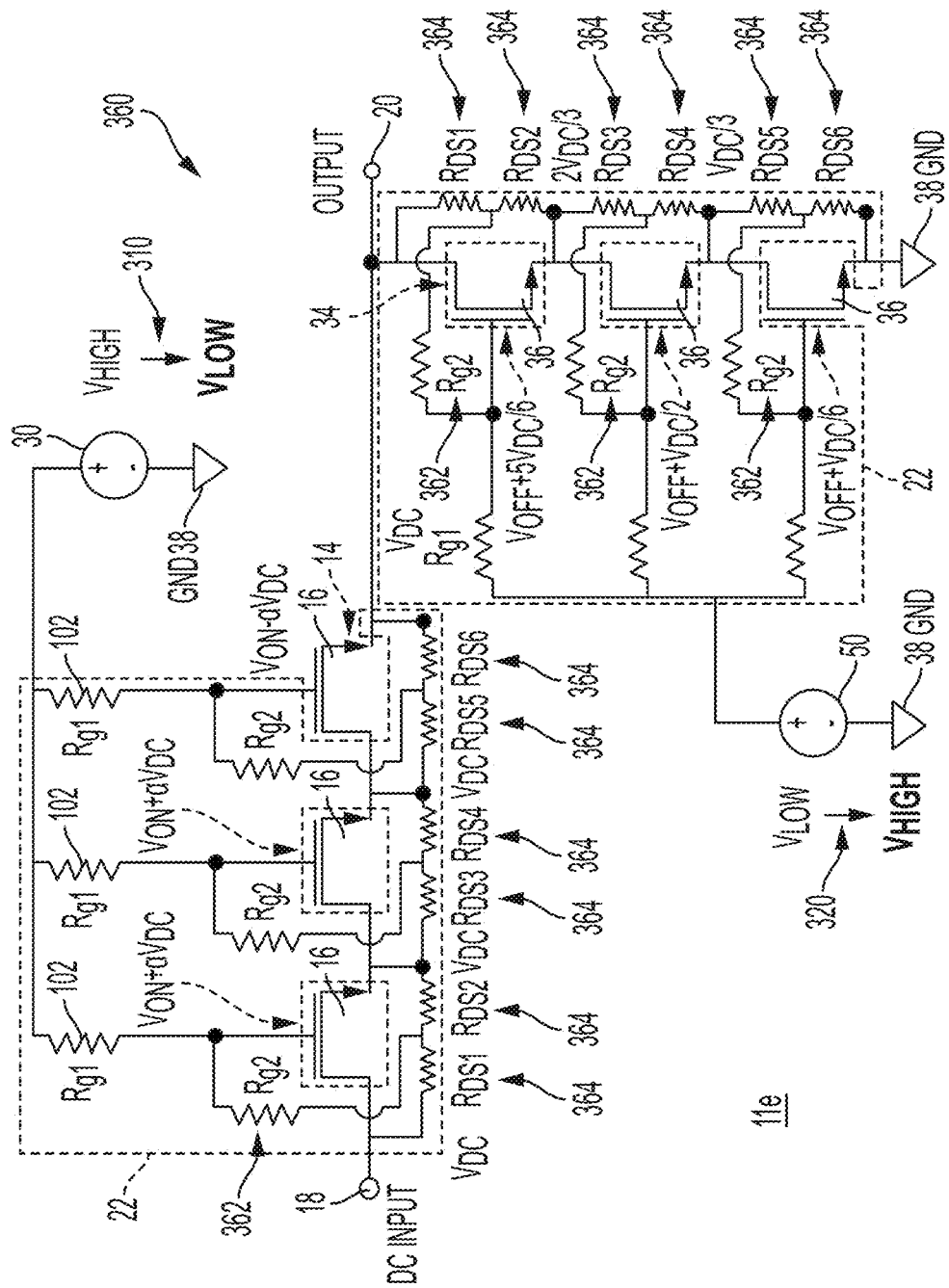
FIG. 5 is a schematic view of a second topology of a DC capable stacked switch bias structure.
Figure 7:
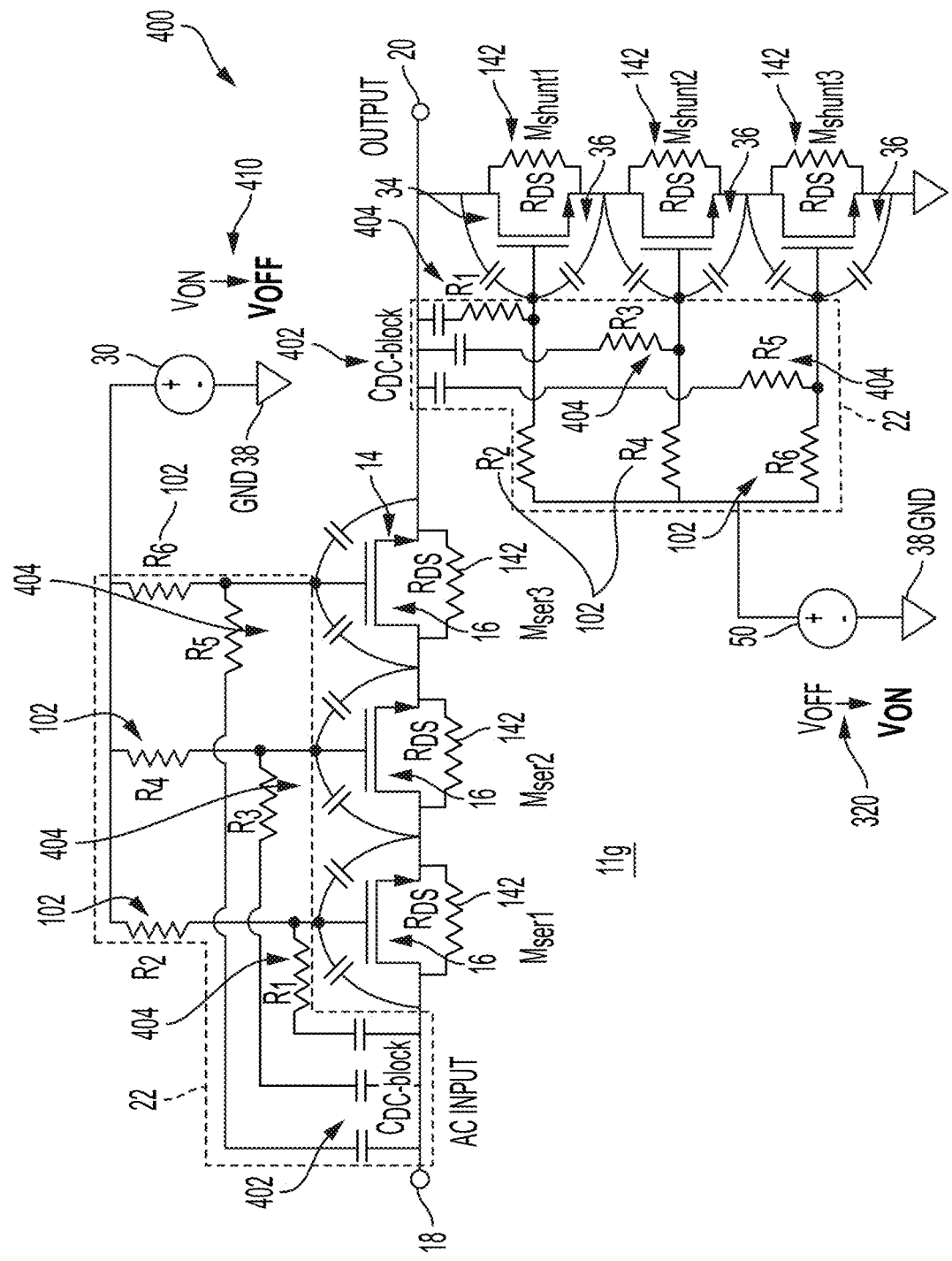
FIG. 7 is a schematic view of a first topology of a bias network configured to lower the low cut-off frequency of a stacked switch structure.
Figure 8:
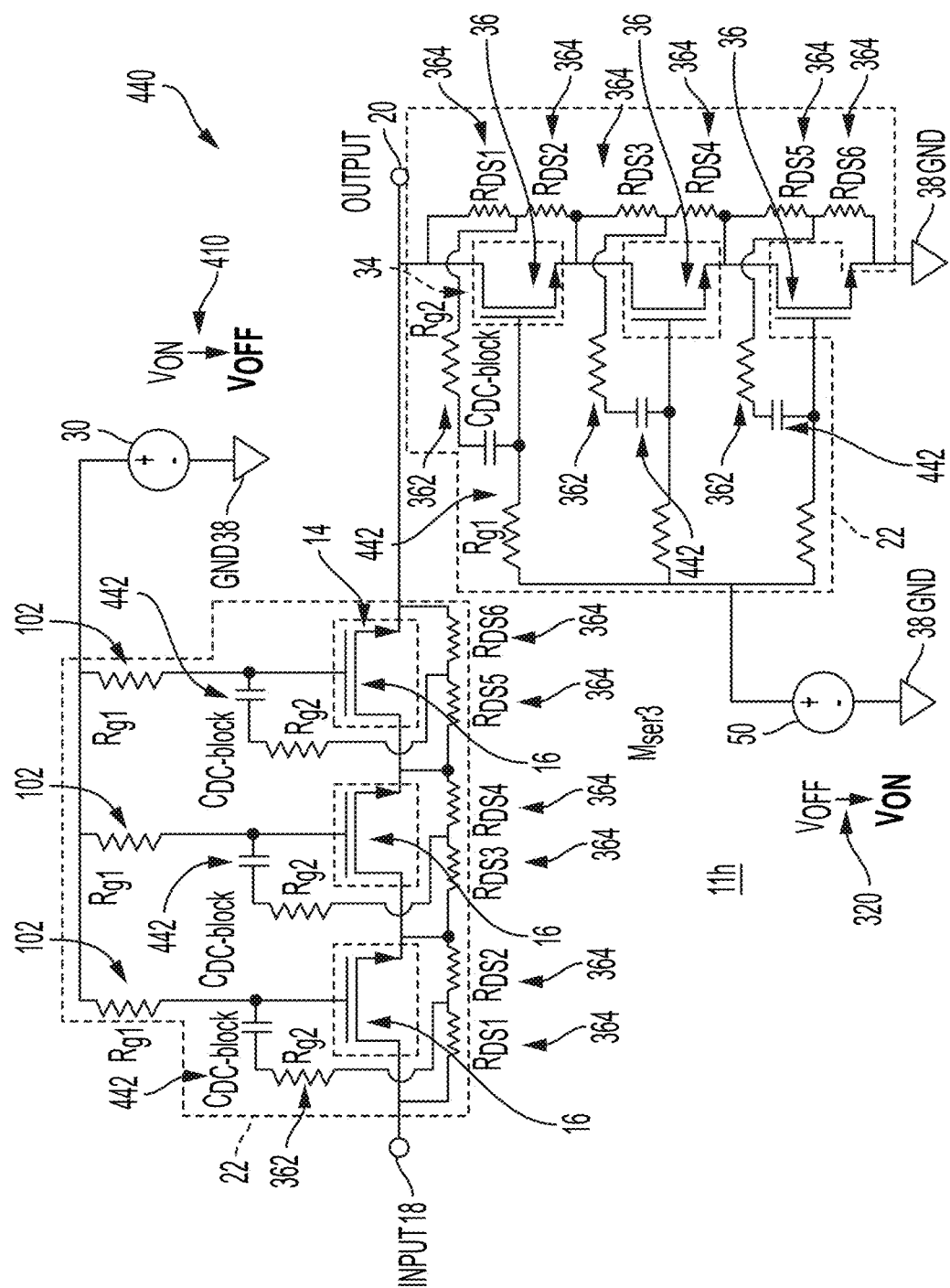
FIG. 8 is a schematic view of a second topology of a bias network configured to lower the low cut-off frequency of a stacked switch structure.
Figure 9:
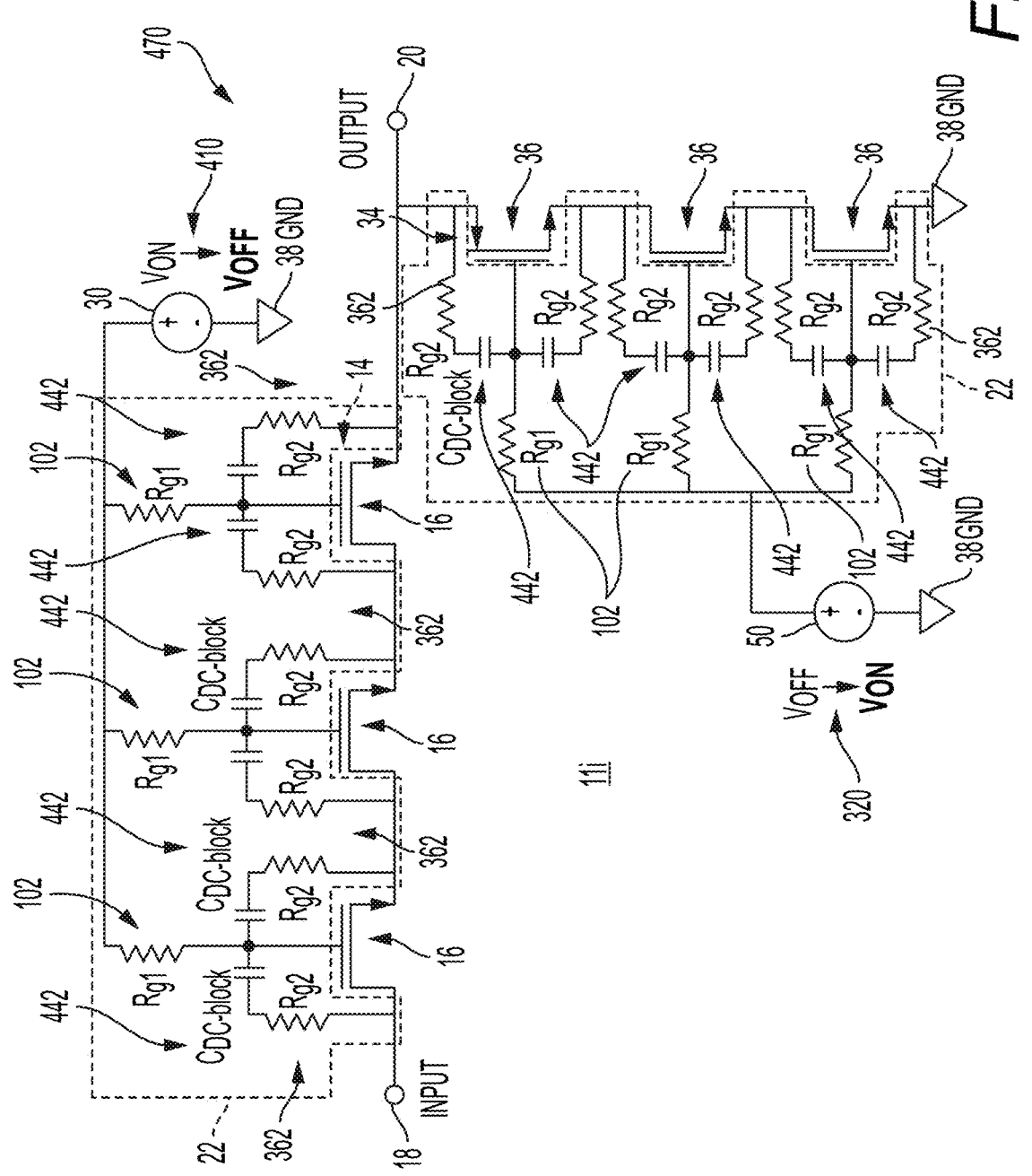
FIG. 9 is a schematic view of a third topology of a bias network configured to lower the low cut-off frequency of a stacked switch structure.

In some embodiments, such as seen in FIGS. 3-8, the series stacked switch 14 and the shunt stacked switch 34 include a plurality of electrically resistive paths, e.g., 142, 362, that extend between the drain terminal 17d, 37d and the source terminal 17s, 37s of each of the corresponding switches 16, 36. For instance, as seen in FIGS. 3, 4 and 7, a single resistor 142 extends between the drain terminal 17d, 37d and the source terminal 17a, 37s of each of the corresponding switches 16, 36. Alternatively, as seen in FIGS. 5, 6, and 8, two resistors 364 are connected in series between the drain terminal 17d, 37d and the source terminal 17s, 37s of each of the corresponding switches 16, 36, wherein the each of the drain paths, e.g., 26, 46, is connected between the gate terminal 17g, 37g of a corresponding one the switches 16, 36 of the stacked switches 14, 34 and a midpoint of the electrically resistive path between each corresponding pair of resistors 364.

As seen in FIG. 2 and FIG. 4, a passive bulk bias network 62 may be coupled between a bulk supply voltage 64,84 and bulk terminals 17b, 37b of the switches 16, 36 of the stacked switches 14, 34. The exemplary stacked switch network 11d seen in FIG. 4 includes bulk bias resistors 342 ($R_{3b}$, $R_{6b}$, $R_{9b}$) between the bulk supply voltage 64,84 and the bulk terminals 17b, 37b of the switches 16, 36 for the stacked switches 14, 34. In some exemplary embodiments 11d, the voltage 64,84 at each of the bulk terminals 17b, 37b can be switched between an OFF state and an ON state, as represented by reference numbers 350 and 352. In some exemplary embodiments 11d, the voltage at the bulk terminals 17b, 37b can be kept at $V_{OFF}$, (e.g., a low voltage, such as $V_{LOW}$) for both open and short circuit conditions of the stacked switches 14, 34, as represented by reference numbers 350, 352.

In some embodiments, the stacked switch structure 11a-11i comprises both a series stacked switch structure and a shunt stacked switch structure, wherein the series stacked switch structure includes a series stacked switch 14 comprising a plurality of series connected switches 16, each of the switches 16 having a gate terminal 17g, a source terminal 17s, and a drain terminal 17d, wherein the series stacked switch 14 is located on a series path 12 between an input 18 and an output 20, and a passive gate bias network 22 electrically coupled between a first supply voltage 30 and the gates 17g of the switches 16 of the series stacked switch 14, wherein the passive gate bias network 22 is electrically connected to the drain 17d of at least one of the switches 16 of the series stacked switch 14, through a plurality of drain paths 26 that include at least one resistor (e.g., 302 and 142 (FIG. 3); 362 and 364 (FIG. 5, FIG. 8); 362 and 364 (FIG. 6); 404 and 142 (FIG. 7); 362 (FIG. 9)), and wherein the corresponding passive gate bias network 22 is configured to set the gate voltages of the switches 16 of the series stacked switch 14 so that the series stacked switch 14 is biased to operate as an OFF or ON series switch, and wherein the shunt stacked switch structure includes a shunt stacked switch 34 comprising a plurality of series connected shunt switches 36, -, each of the shunt switches 36 having a gate terminal 37g, a source terminal 37s, and a drain terminal 37d, wherein the shunt stacked switch 34 is located on a shunt path 32 between the output 20 and a ground 38, a passive shunt gate bias network 22 electrically coupled between a second supply voltage 50 and the gate terminals 37g of the shunt switches 36 of the shunt stacked switch 34, wherein the passive shunt gate bias network 22 is electrically connected to the drain terminal 37d of at least one of the shunt switches 36 of the shunt stacked switch 34, through a plurality of shunt drain paths 46, that include at least one resistor (e.g., 304 and 142 (FIGS. 3 and 4); 362 and 364 (FIGS. 5-6, 8); 404 and 142 (FIG. 7); 362 (FIG. 9)), and wherein the passive shunt gate bias network is configured to set the gate voltages of the shunt switches 36 of the shunt stacked switch 34 so that the shunt stacked switch 34 is biased to operate as an OFF or ON shunt switch.

An exemplary method for establishing a stacked switch structure having a passive gate bias network comprises electrically connecting a plurality of switches 16 in series to form a series stacked switch 14, each of the switches 16 having a gate terminal 17g, a source terminal 17s, and a drain terminal 17d, electrically connecting a passive gate bias network 22 between a supply voltage 30 and the gate terminals 17g of the switches 16 of the series stacked switch 14, electrically connecting the passive gate bias network 22 to the drain terminal 17d of at least one of the switches 16 of the series stacked switch 14, through a plurality of drain paths 26, that each include at least one resistor (e.g., 302 and 142 (FIGS. 3 and 4); 362 and 364 (FIGS. 5-6, 8); 404 and 142 (FIG. 7); 362 (FIG. 9)); and setting the gate voltages $V_g$ of the switches 16 of the series stacked switch 14 so that the series stacked switch 14 is biased to operate as an OFF or ON switch. To form a SPST switch that also includes a shunt stacked switch 34, the method further comprises electrically connecting a plurality of shunt switches 36 in series to form a shunt stacked switch 34, each of the shunt switches 36 having a gate terminal 37g, a source terminal 37s, and a drain terminal 37d, electrically connecting a passive shunt gate bias network 22 between a second supply voltage 50 and the gate terminals 37g of the shunt switches 36 of the shunt stacked switch 34, electrically connecting the passive shunt gate bias network 22 to the drain terminal 37d of at least one of the switches 36 of the shunt stacked switch 34, through a plurality of shunt drain paths 46 that each include at least one resistor (e.g., 304 and 142 (FIGS. 3, 4); 362 and 364 (FIGS. 5-6, 8); 404 and 142 (FIG. 7); 362 (FIG. 9)), and setting the gate voltages of the switches 36 of the shunt stacked switch 34 so that the shunt stacked switch 34 and the series stacked switch 14 can operate together as an OFF or ON single pole single throw (SPST) switch, e.g., 11b. In such configurations, the series stacked switch 14 and the shunt stacked switch 34 are biased oppositely from each other, so that when the series stacked switch network 14 is ON, the shunt stacked switch 34 is OFF, and when the series stacked switch 14 is OFF, the shunt stacked switch 34 is ON.

According to some aspects of the present application, a stacked switch 16, 36 can be used to switchably pass a DC signal 18. For instance, the DC signal 18 can be applied to the input terminal 18 of a stacked switch 14, and the gate terminals 17g of the stacked switch 14 can be switchably controlled to turn the stacked switch 14 ON and OFF as desired. The DC signal 14 passes through the stacked switch 14 to an output terminal 20 when the stacked switch 14 is turned ON. Passing the DC signal 18 may comprise biasing gate terminals 17g of the stacked switch 14 with a passive gate biasing network 22 to a degree that provides for the gate-to-source voltage of the switches 16 of the stacked switch 14 to remain below a gate-to-source breakdown voltage.

In some embodiments of the present application, such as described at least with respect to shunt switch networks 11a-11f, 11h and 11i (FIGS. 1-6, 8 and 9), a stacked switch 14, 34 may comprise a plurality of series-connected switches 16, 36, and means for electrically connecting a passive gate bias network 22 to the drain terminal 17d, 37d of a first switch 16, 36 of the plurality of series-connected switches 16, 36 and to the gate terminals 17g, 37g of the plurality of series-connected switches 16, 36, wherein, as seen at least in FIGS. 3-6, the passive gate bias network 22 is configured to successively reduce, from the first switch 16, 36 to the last switch 16, 36, a voltage applied to respective gate terminals 17g, 37g of the plurality of series-connected switches 16, 36.

There are multiple applications for which lower frequency or DC operation of switches would be desirable. For instance, it may be beneficial to incorporate the techniques described herein for step attenuators and step phase shifters, or for test equipment (e.g., oscilloscopes, etc.) and network analyzers to be configured for wideband operation (e.g., ranging from as high as 50 GHz to as low as 9 kHz). As well, control signals for communication systems (e.g., optical systems) may benefit from low frequency or DC operation of the stacked switch networks 11 described herein.

In contrast to conventional switching structures, which often yield slower switching speed for lower system frequencies, some exemplary embodiments of the stacked switch networks 11 described herein include passive gate bias networks 22 that can operate at lower frequencies, while maintaining high switching speed.

As well, some exemplary embodiments of the stacked switch networks 11 described herein can be used for high voltage applications. Furthermore, some exemplary embodiments of the stacked switch networks 11 described herein can be configured to provide fast switching times, reducing or minimizing the time required for the output of the stacked switch 14, 34 to settle within a given error band of its final value.

As described above, the exemplary stacked switch networks 11a and 11b seen in FIG. 1 and FIG. 2 can generate gate bias voltages 30, 50 and bulk bias voltages 64, 84 using an input DC voltage, in which the input voltages 30 and 50 are respectively coupled to the gate terminals 17g, 37g, and in which the input voltages 64 and 84 are respectively coupled to the body, i.e., bulk terminals 17b, 37b.

As also seen in FIG. 1 and FIG. 2, the passive gate bias networks 22, which are coupled to voltages 30, 50, are also electrically coupled to the drain terminal 17d, 37d of at least one of the switches 16, 36 of the stacked switches 14, 34, through corresponding networks 24, 44 of drain paths 26 and 46. In some stacked switch networks 11, this can be achieved by resistors 302, 304, and $R_{DS}$ resistors 142 (FIG. 3, FIG. 4), $R_{g2}$ resistors 362 and $R_{DS}$ resistors 364 (FIG. 5), by a combination of $R_{g2}$ resistors 362 and $R_{DS}$ resistors 364, and diodes 382 (FIG. 6), by a combination of resistors 404 and $R_{DS}$ resistors 142, and capacitors 402, e.g., a $C_{DC\text{-}block}$ 402 (FIG. 7), by a combination of $R_{g2}$ resistors 362 and $R_{DS}$ resistors 364, and capacitors 402 (FIG. 8), or by a combination of $R_{g2}$ resistors 362 and capacitors 442, e.g., a $C_{DC\text{-}block}$ 442 (FIG. 9).

In some embodiments, the DC capable stacked switches 11 described herein can readily be implemented for test and measurement systems, such as by replacing mechanical switches in testing circuitry. As well, some embodiments of the DC capable stacked switches 11 can be used to generate fast switching operation for AC switches, such as by using high control voltage during switching operations.

FIG. 3 is a detailed schematic view 300 of an exemplary system topology for a DC capable stacked switch network 11c. FIG. 4 is a detailed schematic view 340 of an exemplary bulk connection network for a DC capable stacked switch bias structure 11d, which includes bulk terminals 17b, 37b (FIG. 1) for DC capable bulk bias structures 62, such as applied to the stacked switch bias structure 11c seen in FIG. 3.

In the exemplary system topology for a DC capable stacked switch network 11c seen in FIG. 3, the gate voltages $V_g$ are coupled to the channel voltage, e.g., 30, using the gate resistors $R_g$ 102 (e.g., $R_3$, $R_6$, and $R_9$) as shown. Therefore, as seen in the series stacked switch 14, the gate voltage $V_g$ always tracks the input voltage 30, regardless of the input frequency.

As seen in FIG. 3, to generate the ON voltage ($V_{ON}$) for the short circuited switches 16, a higher control voltage 30 ($V_{HIGH}$) is applied 310 to the resistor network, e.g., 102 and 302. For example, the resistor network for the $M_{ser1}$ switch 16 seen in FIG. 3 includes resistors $R_1$ and $R_2$ 302, and $R_3$ 102. As also seen in FIG. 3, resistors $R_1$ and $R_2$ 304 together act as a voltage divider for $M_{shunt1}$ switch 36, which gives a voltage at the gate 37g of $M_{shunt1}$ switch 36 that is about ⅔ of $V_{DC}$, so that the $M_{shunt1}$ switch 36 is not damaged. As such, the values of resistors $R_1$ and $R_2$ 304 may be chosen to be low enough to create a voltage that counters the voltage 50 being applied through bias resistor $R_3$ 102. Resistors R4 and R5 represent a second voltage divider with a midpoint coupled the gate terminal of the middle transistor of stacked switch 14. Resistors R7 and R8 represent a third voltage divider, with a midpoint coupled to the gate terminal of the third transistor of stacked switch 14.

This resistor network is designed to generate a voltage $V_{ON}$ between the gate source terminals of the series switches 16 for $V_{DC}$=0 at input 18. Thus, $V_{ON}$ can be given as:

$$V_{ON}=V_{HIGH}*(R_1//R_2)/(R_3+R_1//R_2). \quad (1)$$

In some embodiments, $V_{ON}$ may be around 3·V, while $V_{HIGH}$ may be around 5V to 40V.

The $V_{GS}$ voltage of the series switches 16a-16c can be written as:

$$V_{GS}=(V_{HIGH}-V_{DC})*(R_1/R2)/(R_3+R_1//R_2)=V_{ON}-(1-\alpha)*V_{DC}, \quad (2)$$

where α is the voltage tracking ratio between the gate voltages and the input voltage, and can be defined as:

$$\alpha=1-((R_1//R_2)/(R_3+R_1//R_2))=1-V_{ON}/V_{HIGH}. \quad (3)$$

Having α equal to 1 provides that the $V_{GS}$ voltage would be equal to $V_{ON}$, regardless of $V_{DC}$. However, this requires $V_{HIGH}$ to be much larger compared to $V_{ON}$. There is a tradeoff between available control voltage ($V_{HIGH}$) and voltage tracking ratio (α).

Once the series stacked switch 14 is open circuited, the gate voltage $V_g$ of each switch 16 in the series stacked switch 14 should be adjusted to maximize the voltage handling. For an N stack open circuited stacked switch 14, the optimum gate voltage can be given as:

$$V_{G1}=V_{OFF}+V_{DC}(N-1)/2N,$$

$$V_{G2}=V_{OFF}+V_{DC}(N-3)/2N;$$

$$V_{G3}=V_{OFF}+V_{DC}(N-5)/2N, \ldots \text{etc.} \quad (4)$$

The ratio of $R_3$ to $R_1//R_2$, $R_6$ to $R_4//R_5$ and $R_9$ to $R_7//R_8$ can already be determined by the $V_{HIGH}/V_{ON}$ ratio for the short circuit case. Therefore, the ratio of $R_1$ and $R_2$ can be selected to achieve the required voltage division for the open circuit case.

In some system stacked switch networks 11c seen in FIG. 3, $V_{OFF}$ may be around −2.5V, while $V_{LOW}$ may be around −5V to −40V.

Similarly, the ratio of $R_4$ to $R_5$ can be adjusted to satisfy the gate voltage for the open circuit case for the second stacked switches 16 and 36 ($M_{ser2}$ and $M_{shunt2}$), and similarly the ratio of $R_7$ to $R_8$ can be adjusted for the third switches 16 and 36 ($M_{ser3}$ and $M_{shunt3}$) in the series stacked switch 14 and the shunt stacked switch 34.

In order to satisfy the gate voltage of the first open circuited switch 36 seen in FIG. 3, the available $V_{LOW}$ may be at least 2N times larger compared to optimum $V_{OFF}$. Assuming that $V_{HIGH}$ and $V_{LOW}$ are at least 2N times higher compared to $V_{ON}$ and $V_{OFF}$ respectively, the stacked switch networks 11c seen in FIG. 3 can achieve 2N times higher DC voltage handling, as compared to a conventional gate bias approach. This DC voltage handling seen in FIG. 3 is identical to the AC voltage handling behavior of the stacked switch network 11c. Therefore, the exemplary stacked switch network 11c seen in FIG. 3 can handle identical voltages from DC to high frequencies, without sacrificing from a settling time penalty.

FIG. 4 is a detailed schematic view 340 of an exemplary stacked switch networks 11d for a DC capable stacked switch bias structure, which includes bulk terminals 17b, 37b (FIG. 1, FIG. 2) for DC capable bulk bias structures 62, such as applied to the stacked switch network 11c seen in FIG. 3.

In the exemplary DC capable stacked switch network 11d seen in FIG. 4, the bulk terminals 17b of the series switches 16 in the series stacked switch 14, as well as the bulk terminals 37b of the shunt switches 36 in the shunt stacked switch 34, are also provided with passive biasing, in a manner similar to that provided to the gate terminals 17g, 37g. For instance, the exemplary stacked switch networks 11d seen in FIG. 4 includes bulk bias resistors 342 ($R_{3b}$, $R_{6b}$, $R_{9b}$) between the bulk supply voltage 64.84 and the bulk terminals 17b, 37b of the switches 16, 36 for the stacked switches 14, 34.

In some embodiments, identical passive bulk bias networks 62, can be used to bias the bulk terminals 17b, 37b of the respective series and shunt switches 16, 36. In some embodiments, the bulk bias resistor values 342 for the passive bulk bias network 62 can be chosen to be 3-4 times higher than the gate resistors $R_g$ 102, because the parasitic capacitance of the bulk 17b, 37b is often three times to four times smaller than the parasitic gate capacitance 104. The exemplary passive bulk bias networks 62 seen in FIG. 4 also include pairs of resistors 344, 346 for coupling the bulk bias paths for each of the switches 16, 36 in the series stacked switch 14 and the shunt stacked switch 34. In some embodiments, the bulk voltage 64, 84 can be switched as represented by reference numbers 350 and 352, similar to gate voltages 30,50, or can be kept at $V_{OFF}$ for both the open and the short circuit condition of the shunt stacked switch 34 or the series stacked switch 14.

The techniques described herein with respect to gate biasing can readily be applied to bulk biasing, because body, i.e., bulk bias networks can be identical to gate bias networks. In addition, separate bulk bias networks can provide low cut-off frequency and insertion loss improvements.

As described above, the exemplary stacked switch networks 11c and 11d seen in FIG. 3 and FIG. 4 can be implemented for DC-capable operations. In some embodiments, such architectures are implemented using supply voltages of about 10-12 $V_{DC}$.

FIG. 5 is a schematic view 360 of a second exemplary topology for a DC capable stacked switch network 11e, which includes a passive gate bias network 22, for both a series stacked switch 14 and a shunt stacked switch 34. The exemplary DC capable stacked switch network 11e seen in FIG. 5 also enables gate voltages for the switches 16 to track the input DC voltage 18. The exemplary stacked switch network 11e seen in FIG. 5 does not use additional resistors 302, 304 (FIG. 4) between the gate terminals 17g, 37g for either the series stacked switch 14 or the shunt stacked switch 34. Instead, the exemplary stacked switch network 11e seen in FIG. 5 uses the voltage division between $R_{DS}$ resistors 364, to bias the gate voltages and track the input voltage accordingly.

In the exemplary stacked switch network 11e seen in FIG. 5, for the short-circuited switches 16, the $V_{ON}$ voltage can be calculated for $V_{DC}=0$ as:

$$"V_{ON}"=V_{HIGH}(R_{g2}+R_{DS1}//R_{DS2})/(R_{g1}+R_{g2}+R_{DS1}//R_{DS2}). \quad (5)$$

The $V_{GS}$ voltage can be written as:

$$V_{GS}=V_{ON}-(V_{ON}/V_{HIGH})*V_{DC}. \quad (6)$$

$V_{GS}$ can also be written as:

$$"V_{GS}"=V_{ON}+(1-\alpha)*V_{DC}, \text{ where} \quad (7)$$

$$\alpha=1-(R_{g2}+R_{DS1}//R_{DS2})/(R_{g1}+R_{g2}+R_{DS1}//R_{DS2})=1-(V_{ON}/V_{HIGH}) \quad (8)$$

This stacked switch network 11e can be implemented to achieve an identical $V_{GS}$ variation reduction, as compared to the exemplary system topology 11c seen in FIG. 3.

In the exemplary stacked switch network 11e seen in FIG. 5, the optimum gate voltages for the open circuited switches 36 can be obtained using by choosing the correct ratios for the $R_{DS1}$ and $R_{DS2}$ resistors 364 for the first switch 36, the $R_{DS3}$ and $R_{DS4}$ resistors 364 for the second switch 36, and the $R_{DS5}$ and $R_{DS6}$ resistors 364 for the third switch 36.

Therefore, for the exemplary stacked switch network 11e seen in FIG. 5, for each stacked switch 16, 36, the bias for each gate terminal, e.g., 37g can be optimized, by choosing the gate voltages $V_g$, and the overall voltage stress can be evenly distributed between the stacked switches 16, 36.

In the exemplary stacked switch network 11e seen in FIG. 5, the $V_{ON}$ and $V_{OFF}$ voltages are generated on the path defined by $R_{g2}+(R_{DS1}//R_{DS2})$.

The exemplary stacked switch network 11e seen in FIG. 5 can be modified further, by placing a stack 382 of forward diodes $D_1$ and reverse diodes $D_2$ in series with an $R_{g2}$ resistor 362 for each switch 16, 36. For instance, FIG. 6 is a schematic view 380 of a third topology of a DC capable stacked switch network 11f, which includes a stack 382 of forward diodes $D_1$ and reverse diodes $D_2$ in series with $R_{g2}$ resistor 362 for each switch 16, 36, in combination with the voltage division between the $R_{DS}$ resistors 362, to bias the gate voltages and track the input voltage accordingly. The diodes 382 do not change the resistive division function of the drain paths 26, 46, but can be used to control the amount of source voltage needed to apply to the gate terminals 17g, 37g.

In the exemplary DC capable stacked switch network 11f seen in FIG. 6, the $V_{ON}$ and $V_{OFF}$ voltages can be generated by the diode stack 382, with low impedance. As a result, in some exemplary stacked switch networks 11f, the $V_{ON}$ and $V_{OFF}$ voltages can be relatively independent of the input DC voltage ($V_{DC}$) 18.

In the exemplary DC capable stacked switch network 11f seen in FIG. 6, the $V_{GS}$ voltage of the switches 16 for the short circuit case can be calculated as:

$$V_{GS}=V_{DIODE1}+(V_{HIGH}-V_{DIODE1}-V_{DC})(R_{g2}+R_{DS1}//R_{DS2})/(R_{g1}+R_{g2}+(R_{DS1}//R_{DS2})). \quad (9)$$

Assuming the value of $R_{g1}$ resistor 102 is much larger than $R_{g2}+R_{DS1}//R_{Ds}$, the $V_{GS}$ voltages for this exemplary stacked switch network 11f can be determined by the diode voltage ($V_{DIODE1}$), which can be substantially independent of the input DC voltage, assuming $V_{HIGH}$ is larger than $V_{DC}+V_{DIODE1}$.

Similarly, for the open circuit case, the $V_{OFF}$ voltages of the shunt switches 36, can be determined by the diode voltage $V_{DIODE2}$, while the drain source resistors ($R_{DS1}$, $R_{DS2}$ ... ) 364 divide the input DC voltage 18, such that each open circuited switch 36 can withstand 1/N times lower DC input voltage 18.

This architecture, such as provided by the exemplary stacked switch network 11f seen in FIG. 6, can be configured to provide identical DC voltage handling to the other DC stacked switch networks, e.g., 11c-11e, which is 2N times larger compared to conventional stacked switches. An advantage of the exemplary stacked switch network 11f, such as shown in FIG. 6, is that it requires lower control voltages $V_{HIGH}$ and $V_{LOW}$, as compared to the stacked switch networks 11c-11e described above.

While some of the exemplary stacked switch networks 11, e.g., 11c-11f, described herein can be configured for DC operation, several stacked switch networks 11 can be configured to achieve low cutoff frequency operation, although not DC operation. For instance, in some stacked switch networks 11, a series DC block capacitor 402 (FIG. 7) can be used to block the DC voltage. In some embodiments, the use of a series DC block capacitor 402 in conjunction with the series stacked switch 14 or the shunt stacked switch 34 can relieve the need for a high control voltage, e.g., for turn ON and turn OFF operations. In some such embodiments, conventional control voltages, e.g., $V_{ON}=3\cdot V$, and $V_{OFF}=-2.5V$, can be used, instead of higher control voltages, e.g., $V_{HIGH}=5V$ to 40V and $V_{LOW}=-5V$ to $-40V$, which may otherwise be used.

For some low cut-off improvement structures, an input signal can be coupled to the gate terminals 17g, 37g and bulk terminals 17b, 37b of the FETs 16, 36 in the stacked switches 14,34, using a DC block capacitor 402 and resistors 404, 362. In some exemplary embodiments, the low cut-off of the bulk terminals 17b can be improved by connecting the bulk terminal 17b of one switch 16, 36 to the opposite polarity switch 16, 36.

FIG. 7 is a schematic view 400 of a first stacked switch network 11g of a structure for providing a loweredlow cut-off frequency. As seen in FIG. 7, the gate 17g of each the switches 16, 36 is connected through a gate resistor $R_g$ 102 to a corresponding control voltage 30,50, and through a resistor 404 and a DC block capacitor 402, such as between the gate terminals 17g and the signal path 12.

The exemplary DC switch architecture seen in FIG. 7 can be implemented without the need for high supply voltages 30, 50. While the exemplary switch topology seen in FIG. 7 is not configured for true DC operation, the low cutoff performance of the stacked switch network 11g can be significantly improved, by signal coupling the gate terminals, e.g., 17g, 37g, through their respective channel, i.e., for the series stacked switch 14 and for the shunt stacked switch 34. In such stacked switch networks 11g, the low cut-off frequency 208 (FIG. 10) can be determined by the DC-block capacitor 402 and corresponding resistors 404.

FIG. 8 is a schematic view 440 of a second topology of a stacked switch network 11h having a bias network for lowering the low cut-off frequency operation. The system topology 11h seen in FIG. 8 is similar to the DC stacked switch network 11e seen in FIG. 5, but also includes a DC block capacitor 442 for each gate path 26, 46 (FIG. 1), in which each path uses the voltage division between the $R_{DS}$ resistors 364 to bias the gate voltages and track the input voltage accordingly, as described with respect to the exemplary system topology 11e seen in FIG. 5. In a similar manner to the stacked switch network 11e described above, some embodiments of the exemplary stacked switch network 11h seen in FIG. 8 can be used with lower conventional control voltages, e.g., $V_{ON}$=3.3V, and $V_{OFF}$=-2.5V, can be used, instead of higher control voltages, e.g., $V_{HIGH}$=5V to 40V and $V_{LOW}$=-5V to -40V, which may otherwise be used.

FIG. 9 is a schematic view 470 of an exemplary alternate embodiment of a stacked switch network 11i for lowering the low cut-off frequency operation. The exemplary stacked switch network 11i seen in FIG. 9 includes multiple R-C paths extending from gate terminals 17g, 37g for the series stacked switch 14 and the shunt stacked switch 34, wherein the paths include resistors 362 and DC block capacitors 442. For the exemplary system topology 11i seen in FIG. 9, the low cut-off frequency 208 (FIG. 10_ can be determined by the $C_{DC}$-block 442 and the $R_{g2}$ resistors 362.

Figure 10:
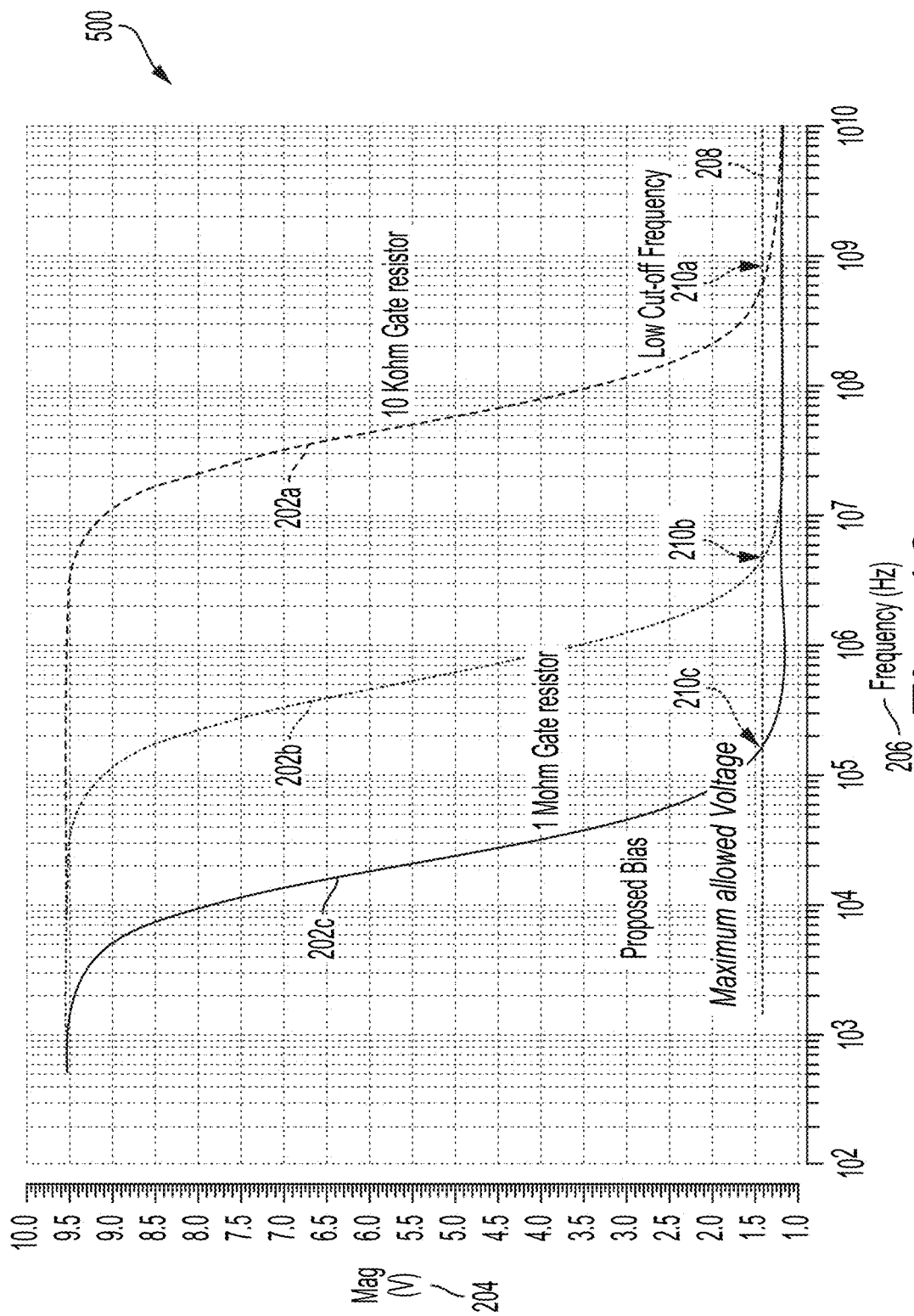
FIG. 10 is a chart showing simulated results for low cut-off frequency performance of a stacked switch structure in accordance with some embodiments.

FIG. 10 is a chart 500 showing exemplary graphs 202a, 202b, and 202c of voltage $V_{gd}$ 204 as a function of frequency 206, such as for a top switch 36 of a shunt stacked switch 34, as compared to graphs 202a and 202b which show exemplary performance for conventional switch structures. For instance, the graph 202c shown in FIG. 10 illustrates the projected low cut-off frequency 210c for an exemplary stacked switch network 11, e.g., 11g-11i, that is configured to improve low cut-off frequency performance, as compared to projected low cut-off frequencies 210a and 210b.

Figure 11:
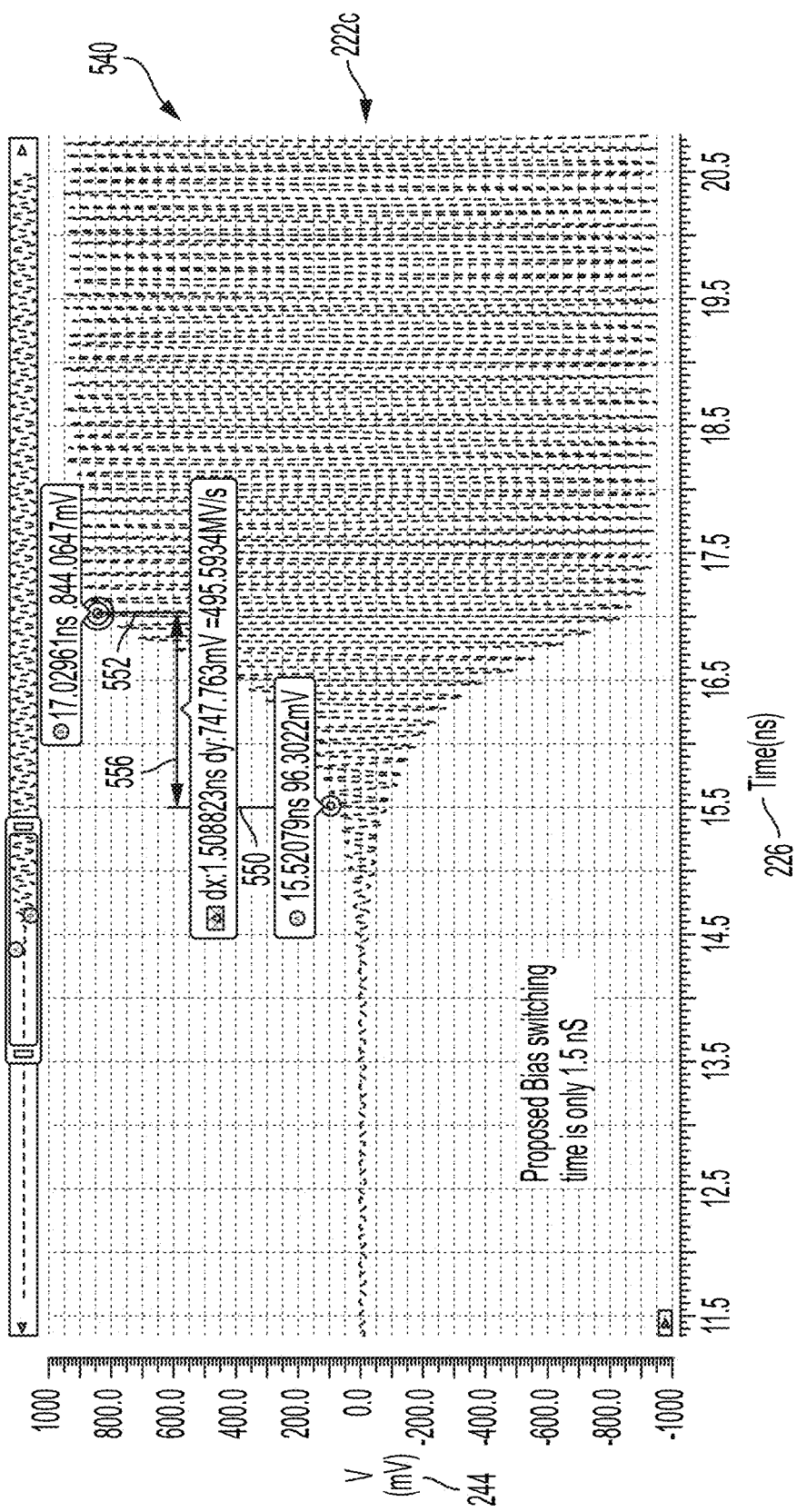
FIG. 11 is a chart showing simulated switching time performance in accordance with some embodiments.

FIG. 11 is a chart 540 showing simulated switching time performance 222c, based on voltage 244 as a function of time 226, in accordance with some embodiments, which yields a bias switching time of 1.5 ns, from 10 percent to 90 percent rise time, as shown:

Point A 550: 15.52079 ns, 96.3022 mV;
Point B 552: 17.02961 ns, 844.0647 mV; and
Delta 556: dx=1.508823 ns, dy=747.763 mV, s=495.5934 MV/s.

As described above, embodiments of the stacked switch networks 11 can include bulk or body bias structures 62 (FIG. 2, FIG. 4), as well as passive gate bias structures 22. For instance, an exemplary bulk bias structure 62 can be connected to bulk terminals 37b of a plurality of stacked switches 36, while the gates 37g may be connected to a gate bias network 22. Bulk bias networks may include $R_{bb}$ resistors between each switch's bulk terminal 37b and a $Rb_{feed}$ resistor 606 (FIG. 12), 342 (FIG. 4) that is used to apply a DC voltage 64, 84 to the respective bulk bias network 62.

In conventional bulk bias structures, the $Rb_{feed}$ resistor 606 can often cause loss due to large AC voltage across the channel. While this loss can be minimized by increasing the resistor value of the $Rb_{feed}$ resistor 606, the $Rb_{feed}$ resistor 606 needs to be low enough to maintain bulk voltage at high signal levels. As well, the parasitic bulk current can degrade the switch performance for low bulk resistor values.

As described above, the stacked switches 14, 34 can include passive body or bulk bias networks 62 in addition to passive gate bias networks 22. While the system topologies described above were associated with a single stacked switch 14 or 34, or a SPST stacked switch network 11 that includes both a series stacked switch 14 and a shunt stacked switch 34, other system topologies can include passive gate bias networks 22 and passive bulk bias networks 62.

For instance, such networks can be integrated within a single pole double throw (SPDT) switch structure, such as to provide two series stacked switches 14, e.g., 14a, 14b (FIGS. 12, 13) that work in opposite polarity, which are connected between a common input 18 and two outputs 20, wherein each of the channels also includes a respective shunt stacked switch 34, e.g., 34a, 34b (FIGS. 12, 13) and wherein the shunt stacked switch 34 for each channel works in opposite polarity with that channel's series stacked switch 14.

Figure 12:
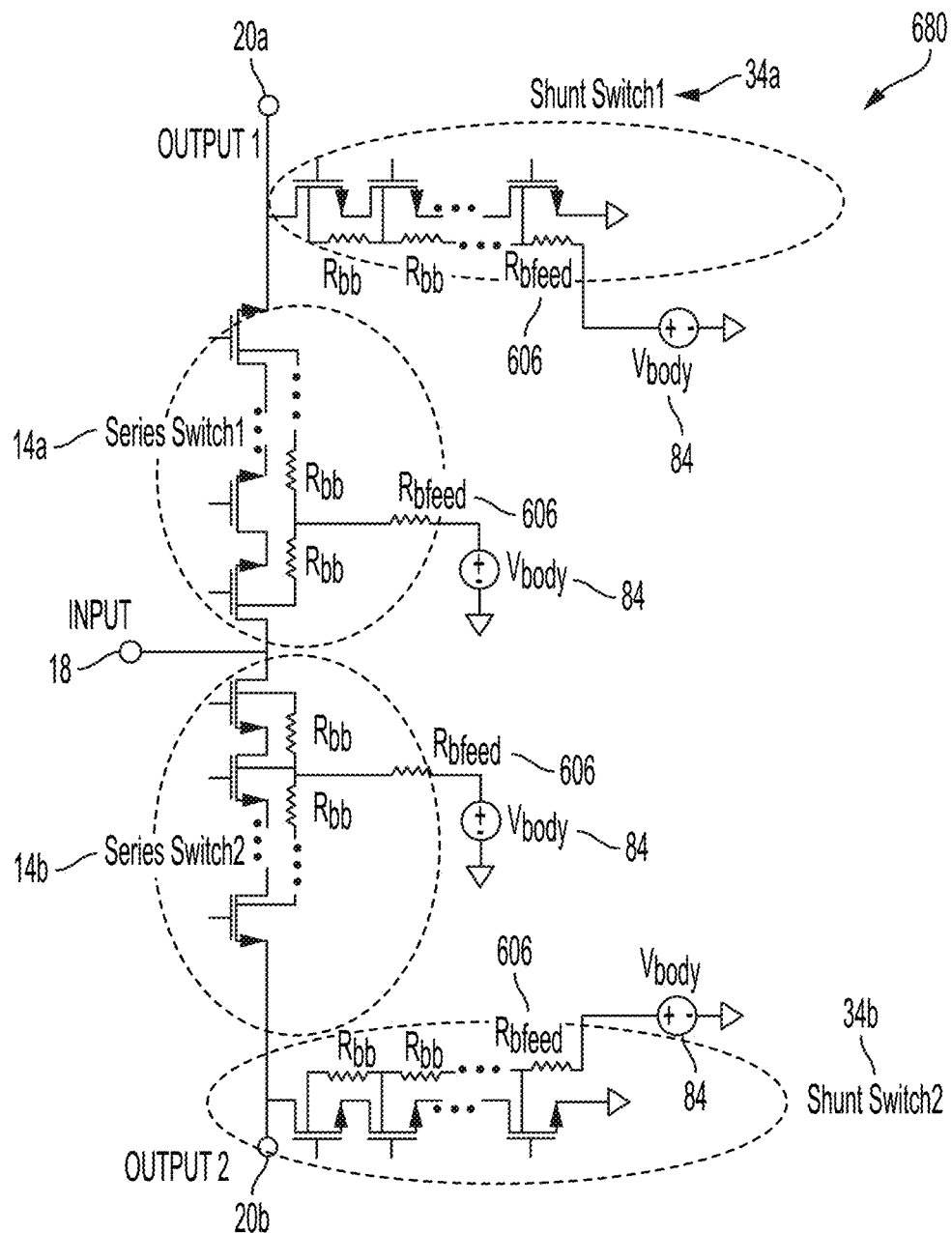
FIG. 12 is a schematic view of a simplified single pole double throw (SPDT) switch having bulk bias, according to a non-limiting embodiment of the present application.

FIG. 12 is a schematic view 680 of exemplary bulk bias structures that can be used for a single pole double throw (SPDT) switch having stacked switches. The exemplary bulk biasing architecture seen in FIG. 12 can include at least one feed resistor 606 for each series stacked switch 14, e.g., 14a and 14b, as well as at least one feed resistor 606 for each shunt stacked switch 34, e.g., 34a and 34b. For the exemplary shunt stacked switches 34a and 34b seen in FIG. 12, the loss on the feed resistors $R_{bfeed}$ 606 can be minimized by connecting the feed resistor 606 at the ground side of the shunt stacked switch 34, so that the feed resistor 606 sees a lower voltage. However, for a short-circuited series stacked switch 14, the feed resistors 606 seen in FIG. 12 face a large AC voltage, which can cause additional loss.

Figure 13:
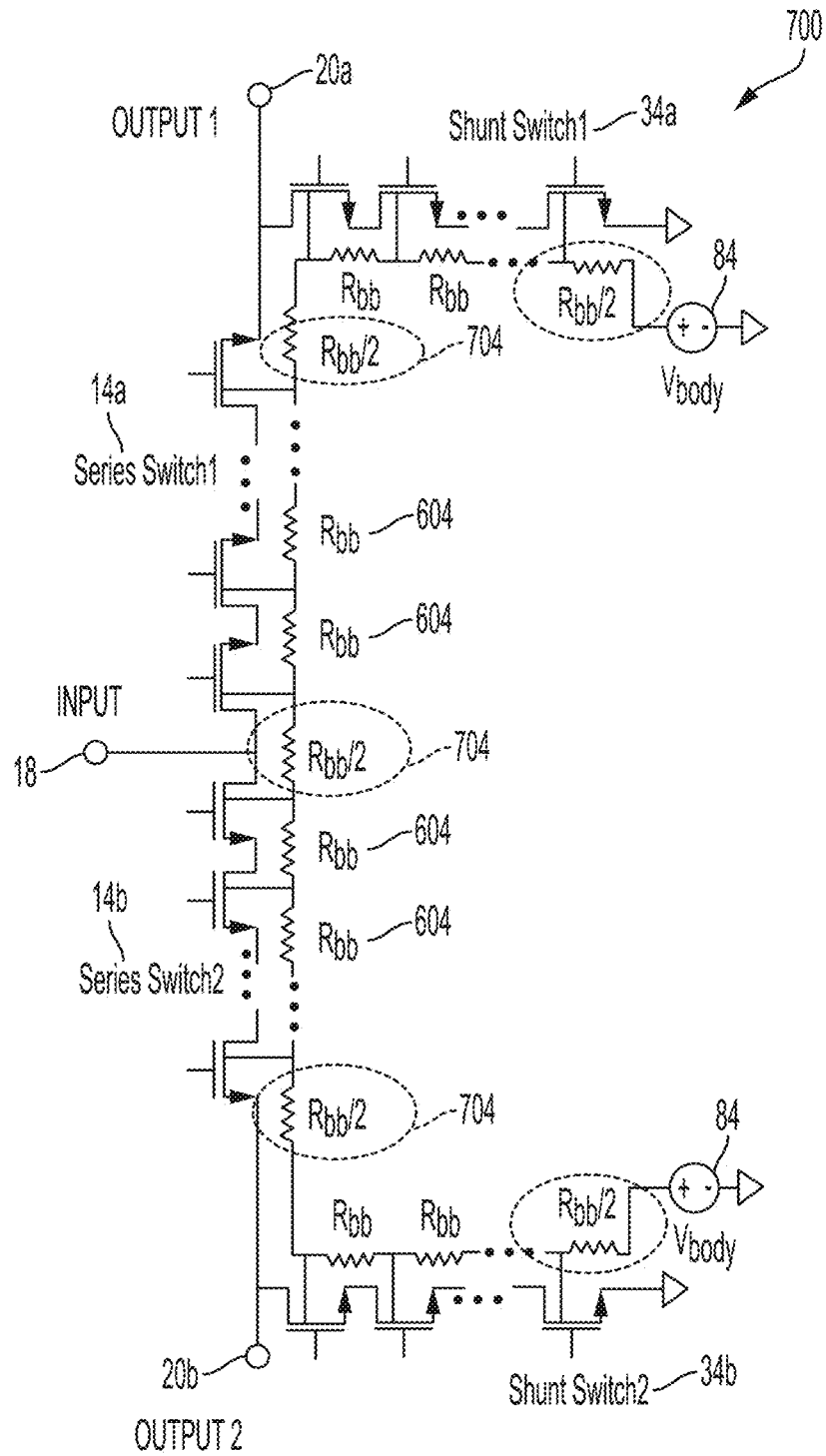
FIG. 13 is a schematic view of an exemplary single pole double throw (SPDT) switch that includes biased bulk terminals.

FIG. 13 is a schematic view of an exemplary single pole double throw (SPDT) switch 700 that includes biased bulk terminals 17b. In the SPDT switch seen in FIG. 13, the bulk terminals 17b of all the stacked switches 14, e.g., 14a and 14b, and 34, e.g., 34a and 34b, are connected using resistors, e.g., 604 and 704. As a result, the bulk terminal 17b, 37b of each open circuited switch 16,36 is connected to the bulk terminal 17b, 37b of a short circuited switch 16,36, using a small resistor 704, which may have half the resistance value ($R_{bb}/2$) of the bulk bias resistors 606 (FIG. 12). The bulk terminal 17b of the short circuited switches 16,36 has a lower low cut-off frequency 208, as compared to the bulk terminal 17b of the open circuited switches 16, 36. The additional bulk terminal 17b connection allows a low frequency AC signal to couple to the bulk terminal 17b of the open circuited switch's bulk terminal 17b, from the short circuited switch's bulk terminal 17b, which improves the low cut-off frequency 208.

In addition, the exemplary bulk network 700 seen in FIG. 13 can improve the insertion loss, by eliminating the need for feed resistors 606 (FIG. 12) for the series switches 16. The bulk terminals 17b of the series switches 16 are biased using the bulk network associated with the shunt switches 36. Since parasitic bulk current only occurs at open circuited stacked switches 14,34, connecting the bulk terminals 17b, 37b of different polarity switches 16, 36 together enables lower DC impedance for the open circuited devices 16,36, without any loss due to feed resistors 606.

Figure 14:
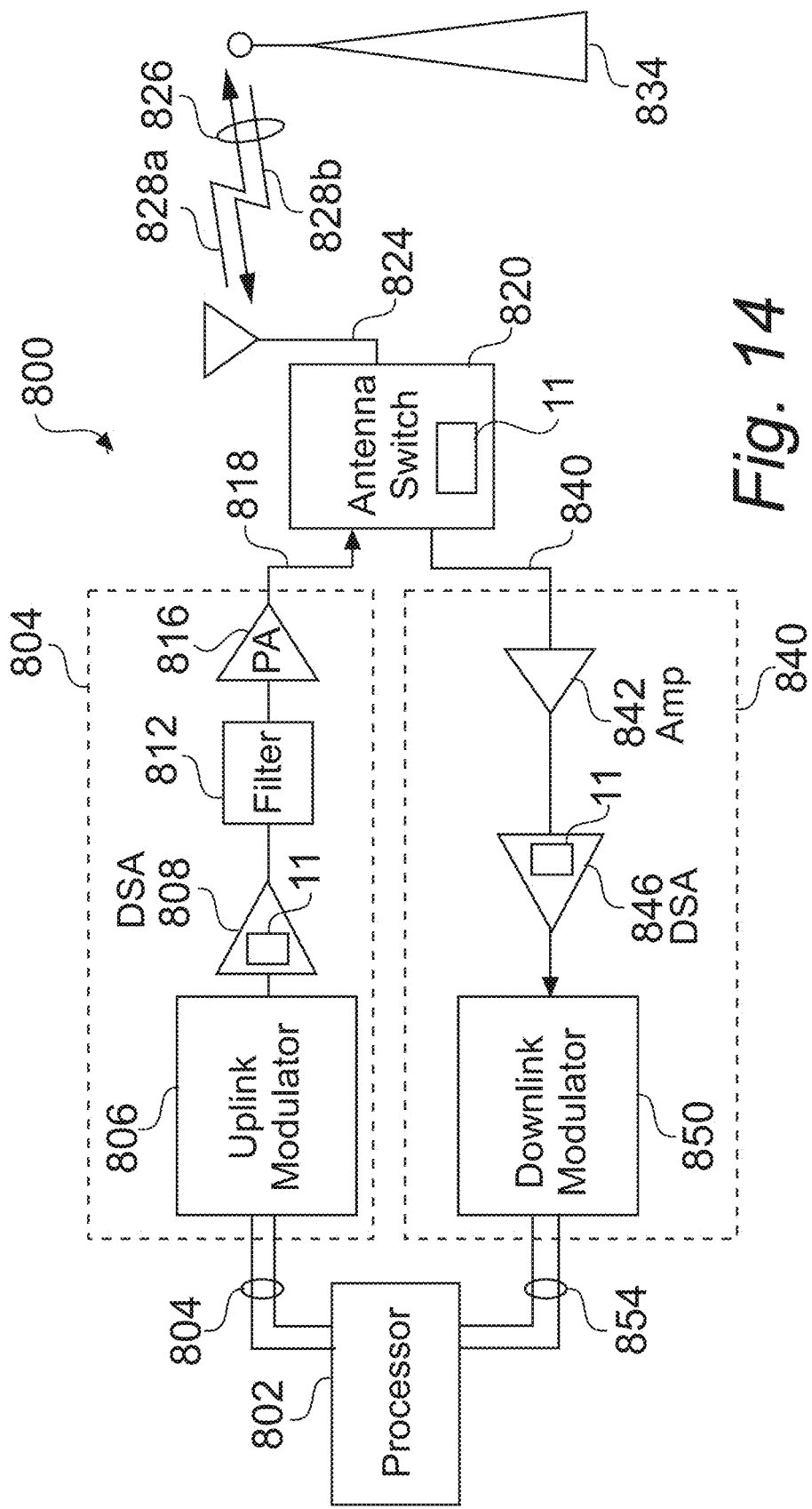
FIG. 14 is a schematic view of an exemplary radio frequency (RF) system that can include one or more stacked RF switch structures according to the present application.

FIG. 14 is a schematic view of an exemplary radio frequency (RF) system 800 that can include one or more enhanced stacked RF switch networks 11. As described above, the stacked switch structures having passive gate bias structures can offer several advantages for different applications. For instance, the exemplary system 800 seen in FIG. 14 may be implemented as a transceiver 800, which can process uplink signals and downlink signals. The exemplary processor 802 seen in FIG. 14 may output an uplink signal 804 to an uplink channel processor 804. The exemplary uplink channel processor seen in FIG. 14 may include an uplink signal modulator 806 that receives the output signal 804 from the baseband processor 802, and outputs the modulated uplink signal through an attenuator 808, a filter 812, and a power amplifier 816, wherein the processed uplink signal 818 is output through an antenna switch 820, to be transmitted from the antenna 824 as a wireless uplink signal 828a, such as over a 2-way communication channel 826, to a receiver 834.

The exemplary system 800 seen in FIG. 14 may also be used to receive and process downlink signals. For example, wireless downlink signals 828b that are received over the 2-way communication channel 826 can be received at the antenna 824, and routed through the antenna switch 820 an incoming downlink signal 840, to a downlink channel processor 840. The routed downlink signal 840 seen in FIG. 14 may be sequentially processed through an amplifier 842, a signal attenuator 846, and a downlink modulator 850, before being output 854 to the baseband processor 802.

The exemplary radio frequency (RF) system 800 seen in FIG. 14 may include one or more of the stacked switch networks 11, as described herein, to provide improved performance for AC and/or DC applications. For instance, the stacked switch structures 11 may be used within one or both of the signal attenuators 808 and/or 846, and/or within one or both amplifiers 816, 842. The stacked switch networks 11 may also be used within the exemplary antenna switch 820, such as to direct the uplink and/or downlink signals 828a, 828b.

While the exemplary stacked switch networks 11 may be configured to be used in a radio frequency (RF) communication system 800, such as seen in FIG. 14, it should be understood that the structures described herein, and methods for their use, can readily be implemented for a wide variety of AC and or DC applications, such as for step attenuators or step phase shifters, for test and measurement devices (e.g., replacing mechanical switches in testing devices), for DC switches that require fast switching operations, for AC switches that may use high control voltages during switching operations, network analyzers and/or other test equipment that require both low frequency operation as well as high frequency functionality, and/or other wireline or optical communication circuits that require low frequency operation.

According to an aspect of the present application, a stacked switch structure is provided, coupled to means for applying successively decreasing voltages to gate terminals of the stacked switch. The stacked switch may be a series stacked switch or a shunt stacked switch. Further, means may be included for biasing the bulk terminals of the stacked switch, such as the series stacked switch or the shunt stacked switch.

Having thus described several aspects of at least one embodiment, it is to be appreciated that various alterations, modifications, and improvements will readily occur to those skilled in the art. As one example, different features were discussed above in connection with different embodiments. Those features may be used alone or in combination unless otherwise noted.

As another example, specific passive devices, such as resistors, capacitors, and $C_{DC}$ blocks are not to be limited as unitary. For example, a $C_{DC}$ block may be a single unitary piece or could be multiple capacitors.

As a further example, while some of the exemplary stacked switches described above include three switches connected in series, the described embodiments are not limited to a specific number, and alternatives may include two or more switches.

As another example, while some of the embodiments are described having switches, transistors, CMOS transistors, or FETs, the described embodiments can be implemented using a variety of switch devices that provide appropriate gates, sources, drains and bulk connections by which the described bias structures and methods can be implemented.

It should be appreciated that aspects of the present application provide a stacked switch comprising a plurality of series-connected switches, and means for electrically connecting a passive gate bias network to the drain terminal of a first switch of the plurality of series-connected switches and to the gate terminals of the plurality of series-connected switches, wherein the passive gate bias network is configured to successively reduce, from the first switch to the last switch, a voltage applied to respective gate terminals of the plurality of series-connected switch.

As a further example, while a group of diodes is described herein to be used in combination with one or more resistive elements, the specific group and arrangement of diodes is not limited to the specific embodiments seen in the figures.

Accordingly, the foregoing description and drawings are by way of example only.

What is claimed is:

1. An apparatus comprising:
   a stacked switch comprising a plurality of series-connected switches from a first switch to a last switch, each switch of the plurality of series-connected switches having a gate terminal, a source terminal, and a drain terminal; and
   a passive gate bias network electrically connected to the drain terminal of the first switch of the plurality of series-connected switches and the gate terminals of the plurality of series-connected switches, and configured to successively reduce, from the first switch to the last switch, a voltage applied to respective gate terminals of the plurality of series-connected switches,
   wherein the passive gate bias network comprises:
      a voltage divider comprising first and second resistors and a midpoint electrically connecting the first and second resistors to one another and to the gate terminal of a switch of the plurality of series-connected switches; and a gate bias path that bypasses each of the first and second resistors of the voltage divider to bias the gate terminal via the midpoint of the voltage divider.

2. The apparatus of claim 1, wherein the passive gate bias network is configured to successively reduce, from the first switch to the last switch, the voltage applied to respective gate terminals of the plurality of series-connected switches to a value producing a gate-to-source voltage for the respective switch that is less than a gate-to-source breakdown voltage for the respective switch.

3. The apparatus of claim 2, wherein the passive gate bias network is configured to set the gate voltages of the switches of the plurality of series-connected switches so that the stacked switch is biased to operate as an OFF or ON switch.

4. The apparatus of claim 1, wherein the passive gate bias network further comprises:
respective voltage dividers coupled to respective gate terminals of the switches of the plurality of series-connected switches, the respective voltage dividers comprising:
the voltage divider, with the midpoint electrically connected to the gate terminal of the first switch; and
a second voltage divider comprising third and fourth resistors and a second midpoint electrically connected to the gate terminal of the last switch; and
a second gate bias path that bypasses each of the third and fourth resistors of the second voltage divider to bias the gate terminal of the last switch via the second midpoint of the second voltage divider.

5. The apparatus of claim 1, wherein the stacked switch is a series stacked switch and the passive gate bias network is a first passive gate bias network, and wherein the apparatus further comprises a shunt stacked switch comprising a plurality of series-connected switches, the apparatus further comprising a second passive gate bias network coupled to the shunt stacked switch and configured to successively reduce a voltage applied to respective gate terminals of the plurality of series-connected switches of the shunt stacked switch.

6. The apparatus of claim 1, wherein each transistor of the plurality of series-connected switches further has a bulk terminal, and wherein the apparatus further comprises a passive bulk biasing network coupled to the bulk terminals of the switches of the plurality of series-connected switches.

7. The apparatus of claim 1, wherein the passive gate bias network further includes a combination of resistors and diodes, the resistors comprising the first and second resistors of the voltage divider, wherein the diodes are positioned between respective gate terminals and drain terminals, to control source voltage needed to change a state of the gate terminals.

8. The apparatus of claim 1, wherein the passive gate bias network further includes a combination of resistors and capacitors, the resistors comprising the first and second resistors of the voltage divider, wherein the capacitors are positioned in conjunction with the stacked switch to block DC voltage.

9. An apparatus comprising:
a series stacked switch having an input terminal configured to receive an input signal and an output terminal configured to provide an output signal of the series stacked switch;

a shunt stacked switch having an input terminal coupled to the output terminal of the series stacked switch and an output terminal coupled to a reference potential;

a first passive gate bias network coupled to gate terminals of the series stacked switch and configured to apply successively decreasing voltages to respective gate terminals of the series stacked switch; and a second passive gate bias network coupled to gate terminals of the shunt stacked switch and configured to apply successively decreasing voltages to respective gate terminals of the shunt stacked switch.

10. The apparatus of claim 9, further comprising a first bulk biasing network coupled to bulk terminals of the series stacked switch and a second bulk biasing network coupled to bulk terminals of the shunt stacked switch.

11. The apparatus of claim 10, wherein the first bulk biasing network is configured to bias the bulk terminals of the series stacked switch, and wherein the second bulk biasing network is configured to bias the bulk terminals of the shunt stacked switch.

12. The apparatus of claim 9, wherein the first passive gate bias network is configured to maintain the voltage applied to respective gate terminals of the series stacked switch to a value producing a gate-to-source voltage for a respective switch of the series stacked switch that is less than a gate-to-source breakdown voltage for the respective switch.

13. The apparatus of claim 12, wherein the first passive gate bias network is configured to set gate voltages of the series stacked switch so that the series stacked switch is biased to operate as an OFF or ON switch.

14. The apparatus of claim 9, wherein the first passive gate bias network is coupled between the input terminal of the series stacked switch and the output terminal of the series stacked switch.

15. The apparatus of claim 9, wherein the first passive gate bias network comprises respective voltage dividers coupled to respective gate terminals of the series stacked switch.

16. The apparatus of claim 9, wherein the first passive gate bias network includes a combination of resistors and diodes, wherein the diodes are positioned between respective gate terminals and drain terminals, to control source voltage needed to change a state of the gate terminals.

17. An apparatus, comprising:
a series stacked switch having an input terminal configured to receive an input signal and an output terminal configured to provide an output signal of the series stacked switch;
a shunt stacked switch coupled to the series stacked switch;
means for applying successively decreasing voltages to gate terminals of the series stacked switch; and
means for applying successively decreasing voltage to gate terminals of the shunt stacked switch.

18. The apparatus of claim 17, further comprising means for biasing bulk terminals of the series stacked switch.

19. The apparatus of claim 17, further comprising means for biasing bulk terminals of the shunt stacked switch.

20. The apparatus of claim 17, wherein the means for applying successively decreasing voltages to the gate terminals of the series stacked switch comprises:
voltage dividing means for providing respective voltages at the gate terminals of the series stacked switch; and
means for bypassing the voltage dividing means to bias the gate terminals of the series stacked switch.

21. The apparatus of claim 1, wherein the passive gate network comprises, for each of the plurality of series-connected switches:
- a voltage divider comprising first and second resistors and a midpoint electrically connecting the first and second resistors to one another and to the gate terminal of the switch;
- a gate bias path that bypasses each of the first and second resistors of the voltage divider to bias the gate terminal via the midpoint of the voltage divider, the gate bias path comprising a third resistor configured to electrically connect the midpoint of the voltage divider to a bias voltage.

22. The apparatus of claim 9, wherein the first passive gate bias network further includes a first combination of resistors and at least one first capacitor, wherein the at least one first capacitor is positioned in conjunction with the series stacked switch to block DC voltage.

23. The apparatus of claim 22, wherein the first passive gate network comprises, for each gate terminal of the series stacked switch, a gate bias path that bypasses the at least one first capacitor to bias the gate terminal, the gate bias path comprising a resistor configured to electrically connect the gate terminal to a bias voltage.

24. The apparatus of claim 22, wherein the second passive gate bias network further includes a second combination of resistors and at least one second capacitor, wherein the at least one second capacitor is positioned in conjunction with the shunt stacked switch to block DC voltage.

25. The apparatus of claim 17, wherein the means for applying successively decreasing voltages to gate terminals of the series stacked switch comprises a first combination of resistors and at least one first capacitor, wherein the at least one first capacitor is positioned in conjunction with the series stacked switch to block DC voltage.

26. The apparatus of claim 25, wherein the means for applying successively decreasing voltages to gate terminals of the series stacked switch comprises, for each gate terminal of the series stacked switch, means for bypassing the at least one first capacitor to bias the gate terminal by electrically connecting the gate terminal to a bias voltage.

27. The apparatus of claim 25, wherein the means for applying successively decreasing voltages to gate terminals of the shunt stacked switch comprises a second combination of resistors and at least one second capacitor, wherein the at least one second capacitor is positioned in conjunction with the shunt stacked switch to block DC voltage.

* * * * *